(12) United States Patent
Kawano et al.

(10) Patent No.: US 10,270,944 B2
(45) Date of Patent: Apr. 23, 2019

(54) IMAGE CAPTURING DEVICE

(71) Applicant: Mitsubishi Electric Corporation, Tokyo (JP)

(72) Inventors: Hiroyuki Kawano, Tokyo (JP); Kosaku Yamagata, Tokyo (JP); Tadashi Minobe, Tokyo (JP); Tatsuya Kunieda, Tokyo (JP); Masatoshi Kodama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/078,689

(22) PCT Filed: Feb. 28, 2017

(86) PCT No.: PCT/JP2017/007723
§ 371 (c)(1),
(2) Date: Aug. 22, 2018

(87) PCT Pub. No.: WO2017/150512
PCT Pub. Date: Sep. 8, 2017

(65) Prior Publication Data
US 2019/0052776 A1    Feb. 14, 2019

(30) Foreign Application Priority Data

Mar. 1, 2016   (JP) ................................ 2016-039052

(51) Int. Cl.
| H04N 3/14 | (2006.01) |
| G02B 3/00 | (2006.01) |
| H01L 27/146 | (2006.01) |

(52) U.S. Cl.
CPC ......... H04N 3/1581 (2013.01); G02B 3/0006 (2013.01); H01L 27/14623 (2013.01);
(Continued)

(58) Field of Classification Search
CPC ................ H04N 3/1581; H04N 3/1568; H01L 27/14678; H01L 27/14623; H01L 27/14627; G02B 3/0006
See application file for complete search history.

(56) References Cited

U.S. PATENT DOCUMENTS 5,661,540 A    8/1997 Kaihotsu et al.
5,825,043 A *  10/1998 Suwa .................. G03F 7/70275
                                                    250/548
(Continued)

FOREIGN PATENT DOCUMENTS

| JP | 6-342131 A | 12/1994 |
| JP | 2000-501857 A | 2/2000 |

(Continued)

OTHER PUBLICATIONS

International Search Report dated May 23, 2017, in PCT/JP2017/007723, filed Feb. 28, 2017.
(Continued)

*Primary Examiner* — Mekonnen D Dagnew
(74) *Attorney, Agent, or Firm* — Oblon, McClelland, Maier & Neustadt, L.L.P.

(57) ABSTRACT

An image capturing device (1) includes: a microlens array (33) including a plurality of micro condenser lenses (34) arranged at a focal position of an imaging optical system for forming a plurality of erect equal-magnification images; and an imaging unit (31) including light-sensitive pixels (32x) provided at positions corresponding to the micro condenser lenses 34. Micro condenser lenses (34) have refractive powers to condense, among light rays incident from the imaging optical system, light rays incident at an incident angle within a predetermined limited angle range, onto positions different from positions on which light rays incident at an incident angle outside the limited angle range are incident. Effective light-sensitive regions of the light-sensitive pixels (32x) receive only light rays incident at an incident angle within the limited angle range among light rays entered micro condenser lenses (32).

20 Claims, 30 Drawing Sheets

(52) U.S. Cl.
CPC .. *H01L 27/14627* (2013.01); *H01L 27/14678* (2013.01); *H04N 3/1568* (2013.01)

(56) References Cited

U.S. PATENT DOCUMENTS

| | | | |
|---|---|---|---|
| 6,014,232 A | 1/2000 | Clarke et al. | |
| 6,057,538 A | 5/2000 | Clarke | |
| 2001/0039061 A1 | 11/2001 | Suzuki et al. | |
| 2001/0043321 A1* | 11/2001 | Nishi | G03F 7/70058 |
| | | | 355/67 |
| 2006/0055834 A1* | 3/2006 | Tanitsu | G03B 27/42 |
| | | | 349/5 |
| 2009/0140131 A1 | 6/2009 | Utagawa | |
| 2012/0229688 A1 | 9/2012 | Tajiri | |
| 2014/0232804 A1* | 8/2014 | Kim | G03G 15/04072 |
| | | | 347/118 |

FOREIGN PATENT DOCUMENTS

| | | |
|---|---|---|
| JP | 2000-507048 A | 6/2000 |
| JP | 2001-160973 A | 6/2001 |
| JP | 2001-223846 A | 8/2001 |
| JP | 2005-50297 A | 2/2005 |
| JP | 2009-288042 A | 12/2009 |
| JP | 2012-189708 A | 10/2012 |
| WO | WO 2006/137481 A1 | 12/2006 |

OTHER PUBLICATIONS

Notification of Reason(s) of Refusal dated Jun. 11, 2018, in Japanese Patent Application No. 2018-503320 (with English Transiation).

* cited by examiner

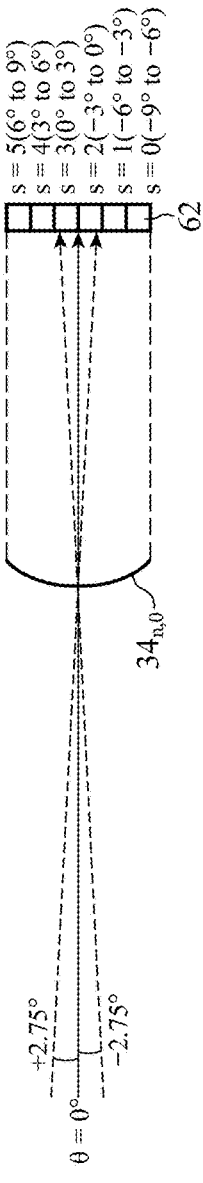
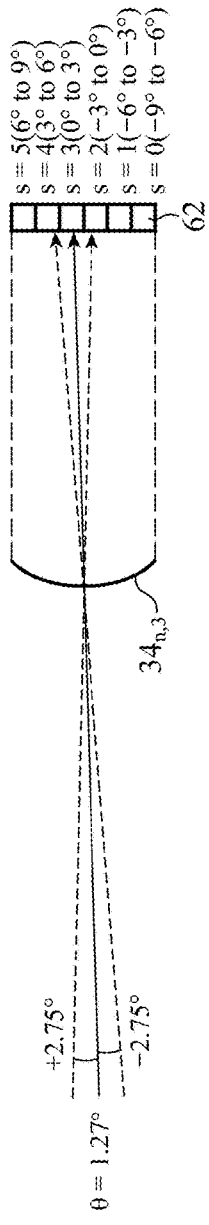
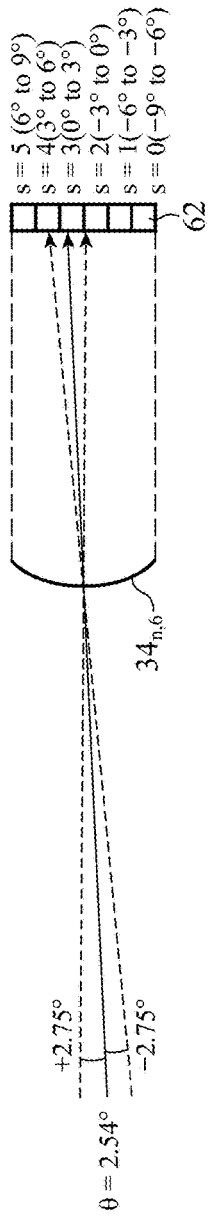
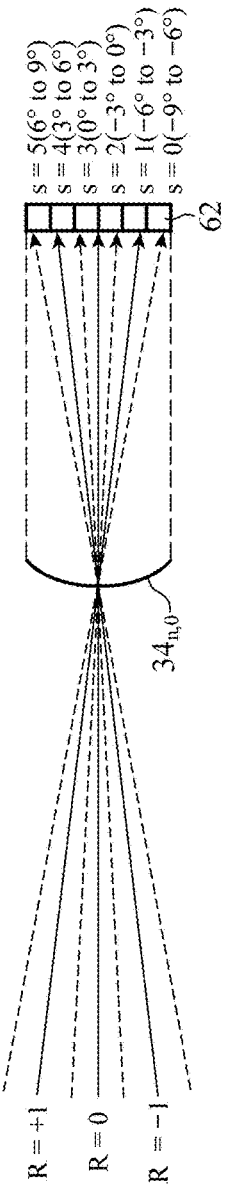

FIG. 34A
ΔZ = 0
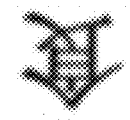
FIG. 34B
R = −1   R = 0   R = 1
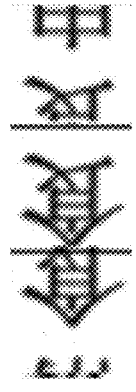
p = −16...+16  p = −16...+16  p = −16...+16
FIG. 34C
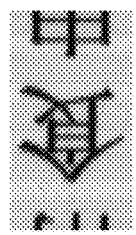
FIG. 34D
ΔZ = 0.6mm
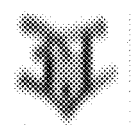
FIG. 34E
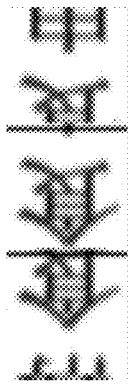
FIG. 34F
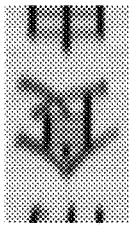
FIG. 34G
ΔZ = −0.6mm
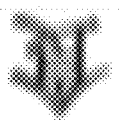
FIG. 34H
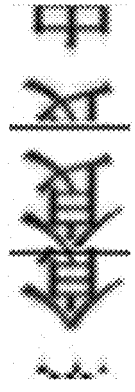
FIG. 34I
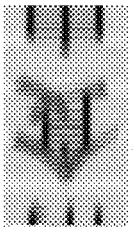
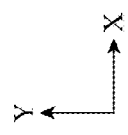

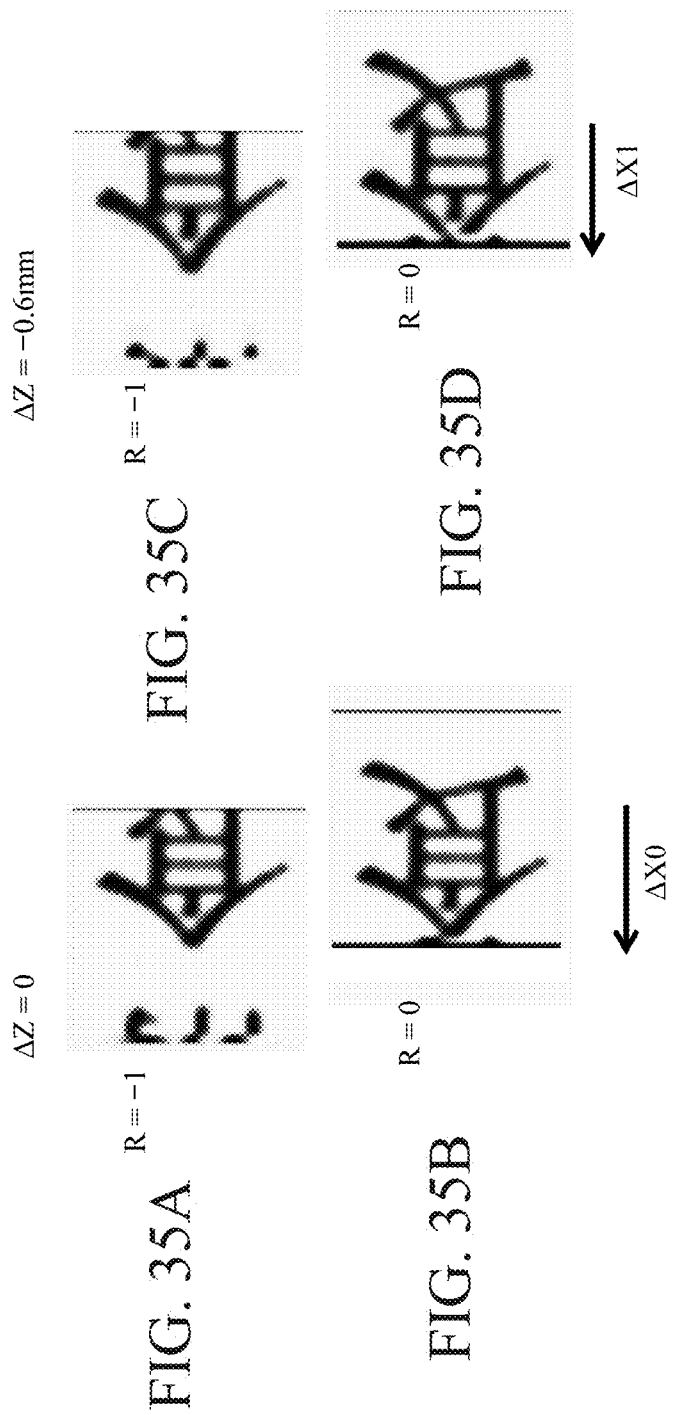

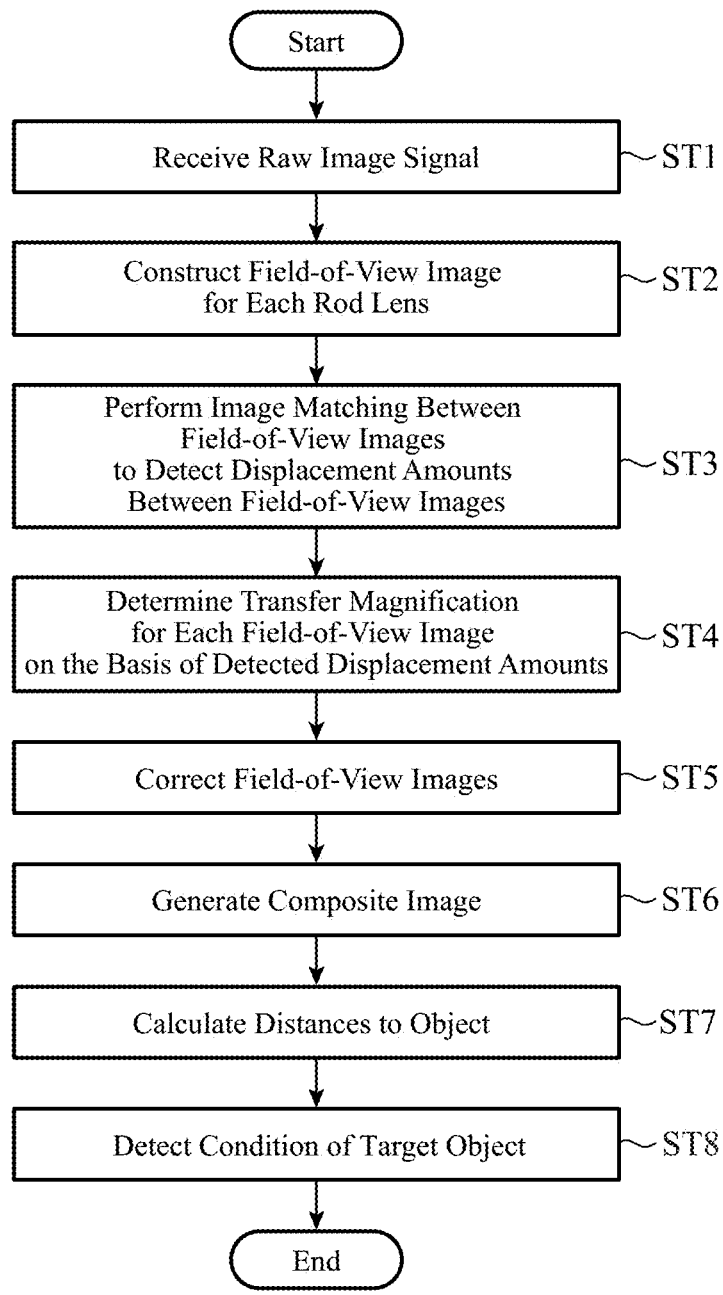

IMAGE CAPTURING DEVICE

TECHNICAL FIELD

The present invention relates to an image capturing device that captures an image formed on a surface of an object such as a document.

BACKGROUND ART

As image capturing devices for capturing an image by scanning a surface of an object using a one-dimensional imaging element having a plurality of light-sensitive pixels arrayed in a line shape, imaging sensors called contact image sensors (CISs) are known. Contact image sensors are widely used for image-capturing functions of, for example, copying machines, image scanners, facsimile machines, or the like. Contact image sensors of these types use an optical element called a rod lens array for forming an erect equal-magnification image, thus there is the problem that the depth of field is small. Therefore, a technique for improving the depth of field is disclosed in Patent Literature 1 (Japanese Patent Application Publication No. 1994-342131), for example.

A contact image sensor disclosed in Patent Literature 1 includes a plurality of lens elements as an optical element for forming an erect equal-magnification image. In order to improve the depth of field, an overlapping limiting member for limiting overlapping of optical images formed by the plurality of lens elements are provided on or near an emitting surface of each of the lens elements.

CITATION LIST

Patent Literatures

Patent Literature 1: Japanese Patent Application Publication No. 1994-342131 (for example, FIGS. 2 and 5, and paragraphs [0015] to [0018]).

SUMMARY OF INVENTION

Technical Problem

In the prior art of Patent Literature 1, since an overlapping limiting member is provided on or near an emitting surface of each of the lens elements, not only the field of view of each of the lens elements is limited, but also the amount of shielded emission light of each of the lens elements is large. Therefore, there is the problem that the amount of received light in the one-dimensional imaging element decreases. That is, on an emitting surface of a lens element and in the vicinity thereof, multiple light rays coming from points at various object heights in the field of view of the lens element overlap. Therefore, shielding, by the overlapping limiting member, unnecessary light rays coming from points of large object heights in the vicinity of the field of view of the lens element necessarily results in also shielding light rays coming from points of small object heights near the center of the field of view. As a result, the amount of received light in the one-dimensional imaging element may be disadvantageously and remarkably reduced.

In view of the foregoing, an object of the present invention is to provide an image capturing device capable of increasing the depth of field while suppressing reduction in the amount of received light of an imaging element.

Solution to Problem

In accordance with one aspect of the present invention, there is provided an image capturing device which includes: an imaging optical system including N imaging optical elements that are arrayed along a main scanning direction that is set in advance where N is an integer larger than or equal to 2, each of the N imaging optical elements forming an erect equal-magnification image on the basis of light scattered by a target object; a microlens array including P micro condenser lenses that are arranged along the main scanning direction at focal positions of the N imaging optical elements where P is an integer larger than N; and an imaging unit including P light-sensitive pixels or P sets of light-sensitive pixel groups that are arranged at positions where light rays are condensed by the microlens array, and are provided to correspond to the P micro condenser lenses, respectively. Each of the micro condenser lenses has a refractive power to condense, among light rays incident from the imaging optical system, light rays incident at an incident angle within a limited angle range that is set in advance, onto positions different from positions on which light rays incident at an incident angle outside the limited angle range are incident. The P light-sensitive pixels or the P sets of light-sensitive pixel groups have an effective light-sensitive region to receive only light rays incident on each of the micro condenser lenses at an incident angle within the limited angle range, among principal rays passed through the N imaging optical elements.

Advantageous Effects of Invention

According to the present invention, it is possible to increase the depth of field while reduction in the amount of received light of an imaging element is suppressed.

BRIEF DESCRIPTION OF DRAWINGS

FIGS. 28A to 28D are diagrams illustrating examples of incident light on a microlens.

FIGS. 34A to 34I are explanatory diagrams of simulation results of image processing.

FIGS. 35A to 35D are explanatory diagrams of an example of image matching processing (step ST3).

FIG. 37 is a flowchart illustrating an exemplary procedure of image processing of the seventh embodiment.

DESCRIPTION OF EMBODIMENTS

Hereinafter, various embodiments according to the present invention will be described in detail with reference to the drawings.

First Embodiment

Figure 1:
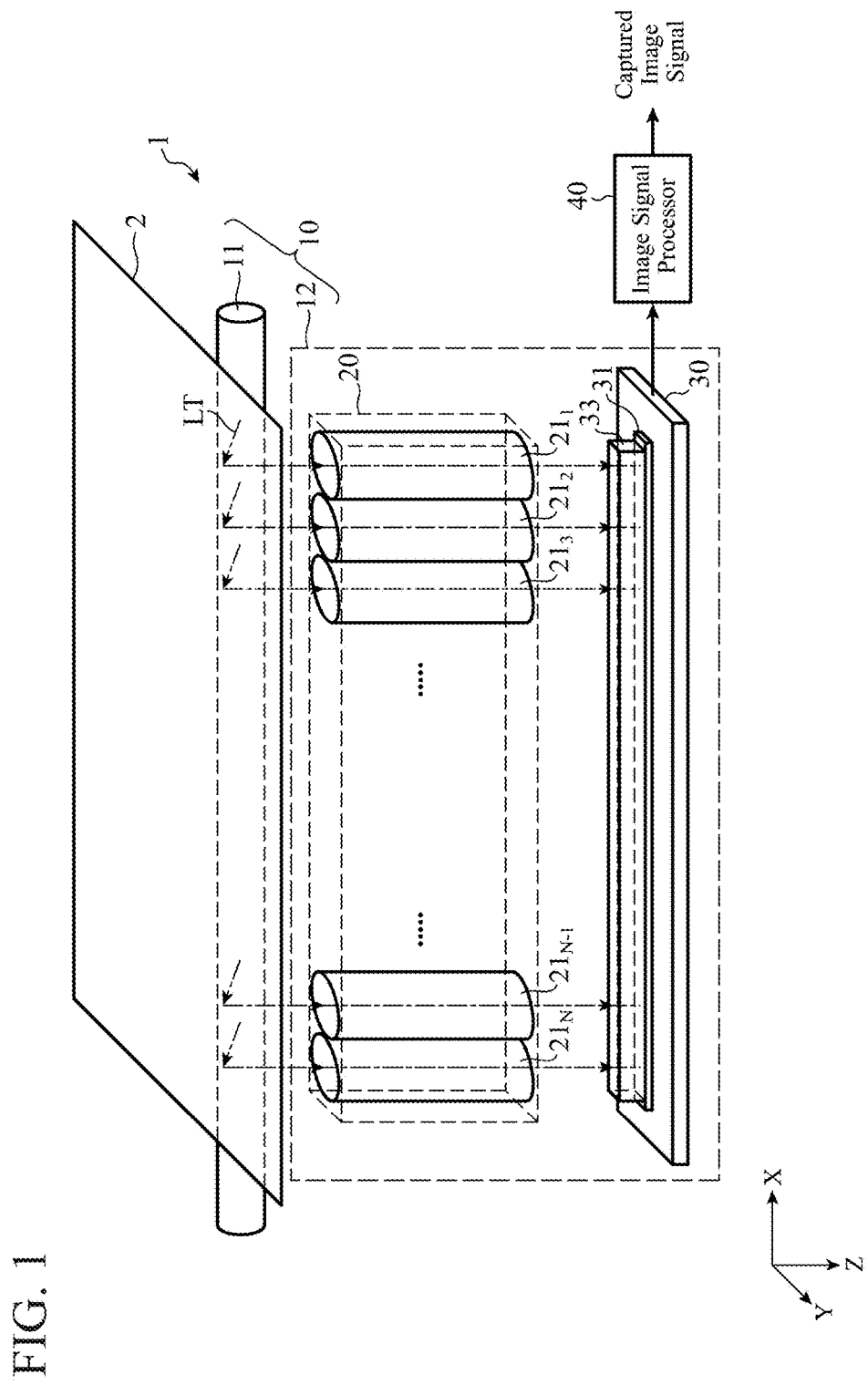
FIG. 1 is a perspective view illustrating a schematic configuration of an image capturing device of a first embodiment according to the present invention.

FIG. 1 is a perspective view schematically illustrating the main part of a configuration of an image capturing device 1 of a first embodiment according to the present invention. As illustrated in FIG. 1, the image capturing device 1 includes a contact image sensor unit 10 (hereinafter referred to as "CIS unit 10") that is an image capturing unit, and an image signal processor 40 that generates a captured image signal by performing image processing on an output signal of the CIS unit 10. The target object 2 is, for example, a sheet object such as a paper medium.

The CIS unit 10 includes: a light source 11 that emits line-shaped illumination light LT along the main scanning direction X (lateral direction in FIG. 1) to a surface to be scanned of the target object 2; a rod lens array 20 which is an imaging optical system that forms a plurality of erect equal-magnification images on the basis of scattered light reflected and scattered by the surface to be scanned of the target object 2; a microlens array 33 arranged at the focal position of the rod lens array 20; an imaging unit 31 including a large number of light-sensitive pixels that receives the light condensed by the microlens array 33; a light shielding pattern (not illustrated) formed between the imaging unit 31 and the microlens array 33; and a sensor substrate 30. The rod lens array 20, the sensor substrate 30, the imaging unit 31, the microlens array 33, and the light shielding pattern are mounted in a single housing 12.

The image capturing device 1 further includes a scanning drive mechanism (not illustrated) that relatively moves the CIS unit 10 along a subscanning direction Y orthogonal to the main scanning direction X with respect to the target object 2. The surface to be scanned of the target object 2 is two-dimensionally distributed along the main scanning direction X and the subscanning direction Y. Therefore, with the CIS unit 10 relatively moving along the subscanning direction Y with respect to the target object 2, the entire surface to be scanned can be scanned. Note that the scanning drive mechanism may be any one of a mechanism that moves the CIS unit 10 in the subscanning direction Y relative to the target object 2 or a mechanism that moves the target object 2 in the subscanning direction Y relative to the CIS unit 10.

As the light source 11, for example, a high-luminescence light source may be used such as a light-emitting diode light source, an organic EL (electroluminescence) light source, and a fluorescent tube. In the example of FIG. 1, the light source 11 and the housing 12 are arranged separately from each other, although no limitation thereto is intended. The light source 11 may be attached to the housing 12.

As illustrated in FIG. 1, the light source 11 is arranged on the same side as the rod lens array 20 with respect to the target object 2. Contrary to this, another light source may be arranged on the opposite side of the target object 2 such that light transmitted by the surface to be scanned of the target object 2 and scattered enters the rod lens array 20. This allows for implementation of an image capturing device that generates a captured image based on transmitted scattered light like a banknote reader used for automated teller machines (ATMs).

The rod lens array 20 is an imaging optical system including a plurality of rod lenses $21_1, 21_2, \ldots, 21_N$ arrayed along the main scanning direction X as imaging optical elements. As illustrated in FIG. 1, each of the rod lenses has a cylindrical shape extending along a Z axis direction orthogonal to both the main scanning direction X and the subscanning direction Y and is made of an optical material that transmits light. Furthermore, each of the rod lenses has one of both end surfaces in the longitudinal direction of the rod lens as an incident surface and the other of the both end surfaces as an emitting surface and forms an erect equal-magnification image on an image-forming plane by propagated, in the longitudinal direction, scattered light incident from the target object 2. Inside each of the rod lenses, a refractive index distribution in which the refractive index continuously changes in the radial direction thereof is formed. By controlling this refractive index distribution, light rays having entered inside each of the rod lenses can be propagated along the longitudinal direction in the form of a substantially sinusoidal wave. By adjusting the total length of each of the rod lenses in the optical axis direction to an appropriate length, it is possible to manufacture a rod lens that forms an erect equal-magnification image.

Figure 2:
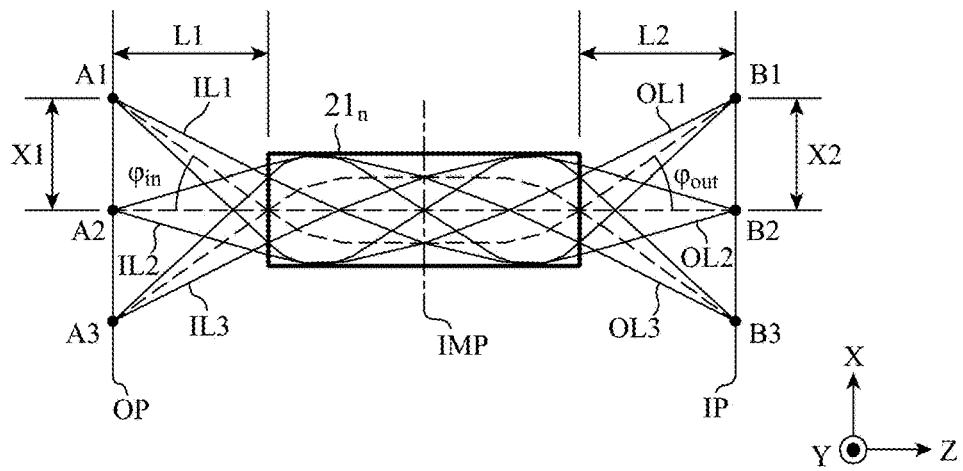
FIG. 2 schematically illustrates a explanatory diagram for image-forming performance of a rod lens of the first embodiment.

FIG. 2 schematically illustrates a explanatory diagram for image-forming performance of an n-th rod lens $21_n$ of the first embodiment. As illustrated in FIG. 2, incident light flux IL1, IL2, and IL3 having entered the rod lens $21_n$ from points A1, A2, and A3 on an object plane OP is propagated inside the rod lens $21_n$ in the form of a substantially sinusoidal wave and then is emitted as emitted light flux OL1, OL2, and OL3, respectively. Then, the emitted light flux OL1, OL2, and OL3 are condensed at points B1, B2, and B3 on an image-forming plane IP, respectively. In order to form an erect equal-magnification image, the position of the object plane OP and the image-forming plane IP has to be uniquely determined. Let a distance in the optical axis direction between the object plane OP and the incident surface of the rod lens $21_n$ be L1, and let a distance in the optical axis direction between the emitting surface of the rod lens $21_n$ and the image-forming plane IP be L2. Here, it is necessary for a distance La specific to the rod lens $21_n$ to satisfy the following expressions:

$$L1=La \text{ and } L2=La.$$

When this relationships holds, the incident light flux IL1, IL2, and IL3 are condensed on an intermediate image-forming plane IMP at an intermediate position in the rod lens $21_n$. As apparent from FIG. 2, an image on the object plane OP is converted into an inverted and reduced intermediate image on the intermediate image-forming plane IMP. This intermediate image is further relay-transferred and forms an inverted magnified image on the image-forming plane IP. Points B1, B2, and B3 on the image-forming plane IP correspond to points A1, A2, and A3 on the object plane OP, respectively, and are arranged at the same interval as the interval of the points A1, A2, and A3. Furthermore, the image on the object plane OP is converted by the rod lens $21_n$ into the erect equal-magnification image on the image-forming plane IP. Let a distance from point A2 to point A1 be X1 and a distance from point B2 to point B1 be X2, and the following equation holds:

$$X2/X1=1.$$

Furthermore, let an incident angle of the principal ray of the incident light flux IL1 propagated from point A1 be $\varphi_{in}$, and an emission angle of the principal ray of the emitted light flux OL1 propagated toward point B1 be $\varphi_{out}$. Here, the following equation (1) holds.

$$\varphi_{in}=\varphi_{out}. \qquad (1)$$

Such a relationship between the incident angle $\varphi_{in}$ and the emission angle $\varphi_{out}$ similarly holds between the incident light flux IL2 and the emitted light flux OL2 and between the incident light flux IL3 and the emitted light flux OL3. As described above, the single rod lens $21_n$ forms an erect equal-magnification image on the image-forming plane IP. The rod lens array 20 of the present embodiment has N rod lenses $21_1$ to $21_N$ having the same configuration as that of the rod lens $21_n$ of FIG. 2 arrayed in a line along the main scanning direction X.

Figure 3:
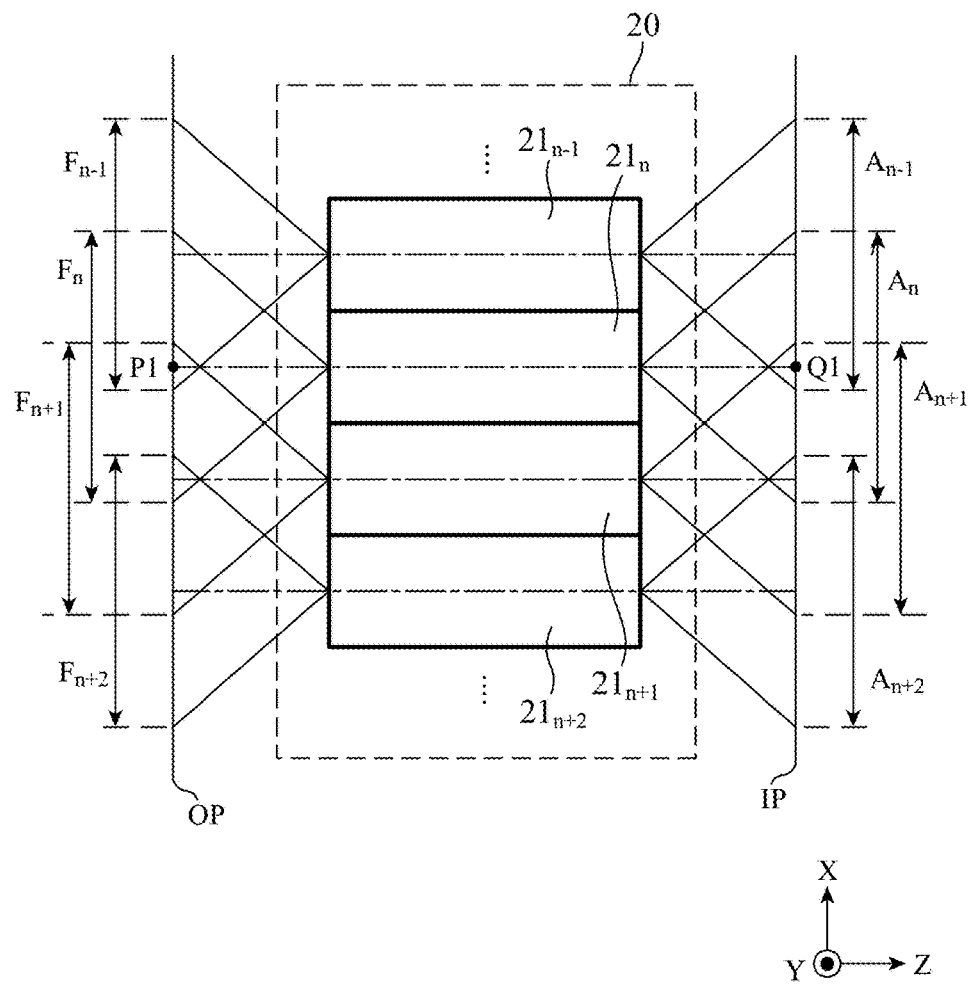
FIG. 3 is a diagram schematically illustrating a field of view and an image-forming area of a plurality of rod lenses.

FIG. 3 is a diagram schematically illustrating the field of view and the image-forming area of rod lenses $21_{n-1}$, $21_n$, $21_{n+1}$, and $21_{n+2}$ included in the rod lens array 20. In the example of FIG. 3, the microlens array 33 and the light shielding pattern 35 which will be described later are not taken into consideration. As illustrated in FIG. 3, the rod lenses $21_{n-1}$, $21_n$, $21_{n+1}$, and $21_{n+2}$ have fields of view $F_{n-1}$, $F_n$, $F_{n+1}$, and $F_{n+2}$, respectively. Here, a field of view refers to a range out of an object plane OP, the range in which an image on the object plane OP can be transferred on an image-forming plane IP. In addition, the rod lenses $21_{n-1}$, $21_n$, $21_{n+1}$, and $21_{n+2}$ form ranges in which an image is transferred on the image-forming plane IP, that is, image-forming areas $A_{n-1}$, $A_n$, $A_{n+1}$, and $A_{n+2}$, respectively. Here as illustrated in FIG. 3, point P1 on the object plane OP is included in all of the fields of view $F_{n-1}$, $F_n$, and $F_{n+1}$, the rod lenses $21_{n-1}$, $21_n$, and $21_{n+1}$ form three point images at the same position Q1. In this manner, in the rod lens array 20, a plurality of rod lenses (in particular, adjacent rod lenses) has fields of view superimposed on each other and forms erect equal-magnification images superimposed on each other. Therefore, on the image-forming plane IP, the plurality of images transferred by the rod lenses $21_1$ to $21_N$ overlaps each other to form one image.

Figure 4:
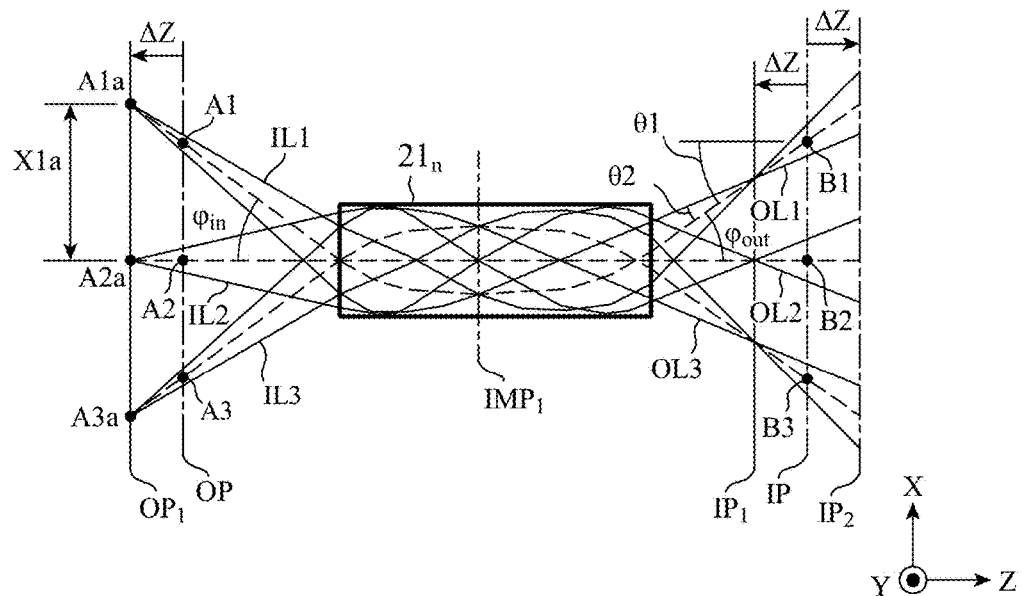
FIG. 4 schematically illustrates a explanatory diagram for image-forming performance of a rod lens when defocused.
Figure 5:
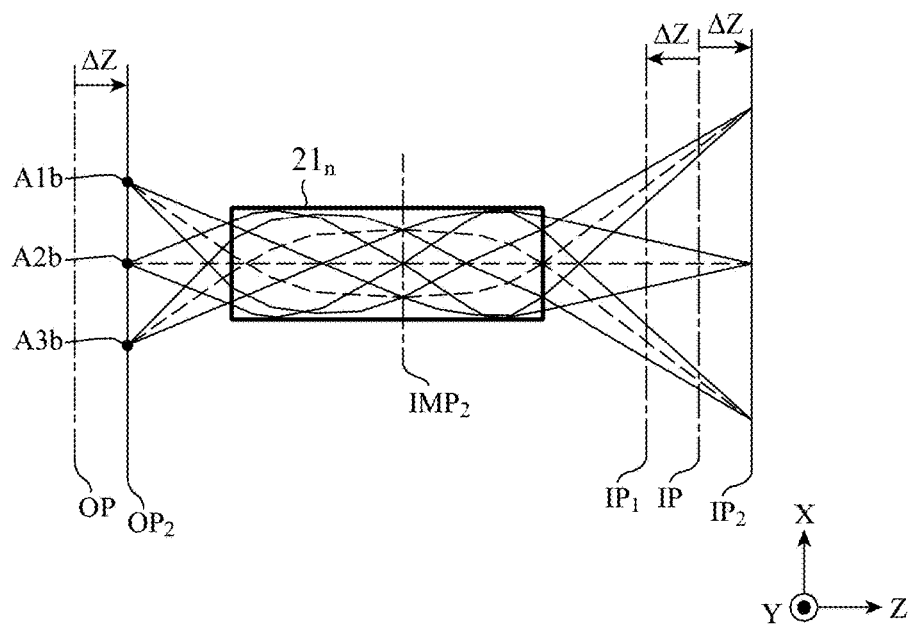
FIG. 5 schematically illustrates a explanatory diagram for image-forming performance of a rod lens when defocused.

Next, image-forming performance of the rod lens $21_n$ when defocused will be described with reference to FIGS. 4 and 5. FIG. 4 is a diagram illustrating optical paths in the case where an object plane $OP_1$ is formed at a position moved by −ΔZ in a Z axis direction from an object plane OP in focus, and FIG. 5 is a diagram illustrating optical paths in the case where an object plane $OP_2$ is formed at a position moved by +ΔZ in the Z axis direction from the object plane OP in focus. In the examples of FIGS. 4 and 5, the microlens array 33 and the light shielding pattern 35 which will be described later are not taken into consideration.

As illustrated in FIG. 4, incident light flux IL1, IL2, and IL3 having entered the inside the rod lens $21_n$ from points A1a, A2a, and A3a on the object plane $OP_1$ that is defocused forms an intermediate image on an intermediate image-forming plane $IMP_1$ inside the rod lens $21_n$ and then is emitted as emitted light flux OL1, OL2, and OL3, respectively. The emitted light flux OL1, OL2, and OL3 is condensed on the image-forming plane $IP_1$ and then is propagated to points B1, B2, and B3 on an image-forming plane IP in focus. Since the object plane $OP_1$ that is defocused is formed at a position apart from the object plane OP in focus by $-\Delta Z$ in the Z axis direction, the intermediate image-forming plane $IMP_1$ is also formed at a position on the left side apart from an intermediate position of the rod lens $21_n$ in the Z axis negative direction. An image-forming plane $IP_1$ is also formed at a position on the left of the image-forming plane IP in focus. When $\Delta Z$ is a small value, the image-forming plane $IP_1$ is formed at a position apart from the image-forming plane IP in focus by approximately $-\Delta Z$ in the Z axis direction. On an image plane $IP_2$ at a position apart from the image-forming plane IP in focus by $+\Delta Z$ in the Z axis direction, since an incident angle $\varphi_{in}$ is equal to an emission angle $\varphi_{out}$, an image on the object plane $OP_1$ is transferred being defocused and transferred with an erect equal-magnification. Therefore, the following two items $\Gamma 1$ and $\Sigma 1$ are derived.

Item $\Gamma 1$: Since the image plane $IP_2$ is on the right side of the image-forming plane IP in focus, the magnification (transfer magnification) of the image formed on the image-forming plane IP is a reduction.

Item $\Sigma 1$: Since the image-forming plane IP in focus is on the right side of the image-forming plane $IP_1$ that is defocused, an image formed on the image-forming plane IP is a blurred image out of focus.

Regarding item $\Gamma 1$, let a distance in an X axis direction from point A2a to point A1a be X1a, the ratio of the distance X2 (FIG. 2) to the distance X1a is smaller than 1 as expressed in the following inequality:

$X2/X1a<1.$

If a situation occurs in which the transfer magnification of an image is different among adjacent rod lenses in the rod lens array 20 due to the item $\Gamma 1$, a positional shift occurs between the images formed by each of the adjacent rod lenses. As a result, a composite image in which two, three, or more positional shifts of the image is occurring is formed. Furthermore, due to the item $\Sigma 1$, a blurred composite image being out of focus is formed. Therefore, an image formed by the entire rod lens array 20 is deteriorated.

Here, the degree of deterioration of an image is larger in the case of the item $\Gamma 1$ than in the case of the item $\Sigma 1$. The reason will be explained below. Now, as illustrated in FIG. 4, let a condensing angle (half the angle of a cone) of the emitted light flux OL1 condensed to point B1 be $\theta 2$ and an incident angle to the image-forming plane IP of the principal ray of the emitted light flux OL1 reaching point B1 be $\theta 1$. Assuming that a distance between the optical axis of the rod lens $21_n$ and point B1 in the X axis direction is larger than the radius of the rod lens $21_n$, it is apparent that the incident angle $\theta 1$ is larger than the condensing angle $\theta 2$ as expressed in the following inequality:

$\theta 1>\theta 2.$

The amount of movement of an image due to the item $\Gamma 1$ is about $\Delta Z \times \theta 1$, and the radius of a blurred image caused by the item $\Sigma 1$ is about $\Delta Z \times \theta 2$. Therefore, the degree of deterioration of an image is larger in the case of the item $\Gamma 1$ than in the case of the item $\Sigma 1$.

On the other hand, in the case of being defocused illustrated in FIG. 5, the incident light flux IL1, IL2, and IL3 having entered the inside the rod lens $21_n$ from points A1b, A2b, and A3b on the object plane $OP_2$ that is defocused forms an intermediate image on an intermediate image-forming plane $IMP_2$ inside the rod lens $21_n$ and then is emitted. The emitted light flux is condensed on the image-forming plane $IP_2$. Also in the case of being defocused illustrated in FIG. 5, similar examination to that of the case illustrated in FIG. 4 derives the following items $\Gamma 2$ and $\Sigma 2$.

Item $\Gamma 2$: The magnification (transfer magnification) of an image formed on the image-forming plane IP in focus is a magnification for enlargement.

Item $\Sigma 2$: Since the image-forming plane IP in focus is on the left side of the image-forming plane $IP_2$ of FIG. 5 that is defocused, an image formed on the image-forming plane IP is a blurred image out of focus.

In the examples of FIGS. 4 and 5 described above, the microlens array 33 and the light shielding pattern 35 are not taken into consideration. By introducing the microlens array 33 and the light shielding pattern 35 which will be described later, positional displacement between images, mainly caused by the above items $\Gamma 1$ and $\Gamma 2$ and causing a relatively large degree of deterioration of an image, can be got out.

Figure 6:
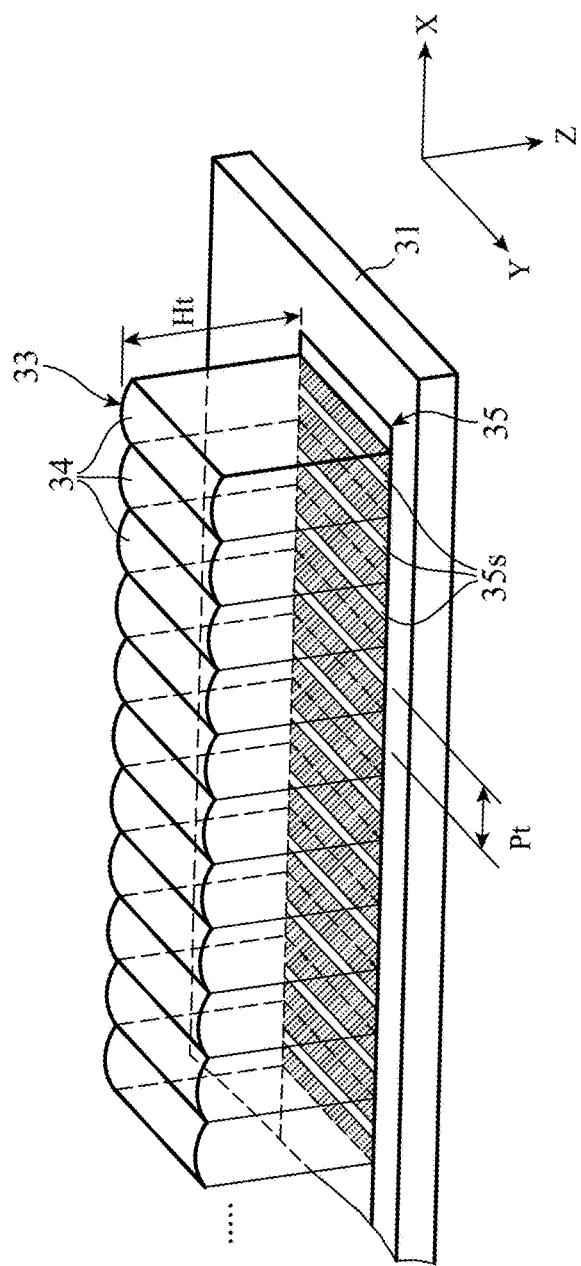
FIG. 6 is a perspective view illustrating a schematic configuration of a microlens array and a light shielding pattern of the first embodiment.

Next, the microlens array 33 and the light shielding pattern 35 will be described. FIG. 6 is a perspective view illustrating a schematic configuration of the microlens array 33 and the light shielding pattern 35.

As illustrated in FIG. 6, the microlens array 33 has a large number of micro condenser lenses 34 arrayed along the main scanning direction X. Each of these micro condenser lenses 34 (hereinafter also referred to as "microlenses 34") has a lens surface of a cylindrical shape (cylindrical shape) arranged at the focal position of the rod lenses $21_1$ to $21_N$. This lens surface has a positive refractive power in the main scanning direction X with respect to light flux incident from the rod lens array 20 but does not have a refractive power in the subscanning direction Y. Therefore, this lens surface has a non-zero curvature (reciprocal of the radius of curvature) in the main scanning direction X but has no curvature in the subscanning direction Y. Furthermore, the lens surface of the cylindrical shape has a top part extending along the subscanning direction Y. An interval (pitch) Pt in the main scanning direction X between top parts of adjacent microlenses 34 and 34 is constant. Furthermore as illustrated in FIG. 6, the microlens array 33 has a constant thickness Ht in the Z-axis direction (that is, the thickness in the Z-axis direction between a top part of a lens surface of a microlens 34 and the bottom surface of the microlens 34). Such a microlens array 33 can be manufactured using a lens material such as resin or quarts.

The microlens array 33 condenses incident light flux from the rod lens array 20 on the light-sensitive pixel groups (not illustrated in FIG. 6) of the imaging unit 31. The light shielding pattern 35 made of a light-absorbing material is formed between the imaging unit 31 and the microlens array 33. The light shielding pattern 35 is arranged at the focal position of the microlens array 33 and has a function of shielding a part of light condensed by the microlens array 33.

As illustrated in FIG. 6, the light shielding pattern 35 has openings 35s each formed at a position corresponding to each of the top parts of the microlenses 34. Each of these openings 35s is arranged on each of the optical axes of the microlenses 34. In addition, each of the openings 35s forms a slit extending along a top part of a lens surface of a corresponding microlens 34. Only a part of light flux condensed by the microlens array 33 can reach a light-sensitive pixel through the opening 35s. An array pitch of the openings 35s in the main scanning direction X is the same as the array pitch Pt of the top parts of the microlens 34. The array pitch of the rod lenses $21_1$ to $21_N$ in the main scanning direction X is larger than the array pitch Pt. As will be described later, the light shielding pattern 35 has a function to shield unnecessary light rays incident at an incident angle larger than or equal to a predetermined limit angle (that is, an incident angle outside the limited angle range), among light rays incident on the microlens array 33.

Figure 7:
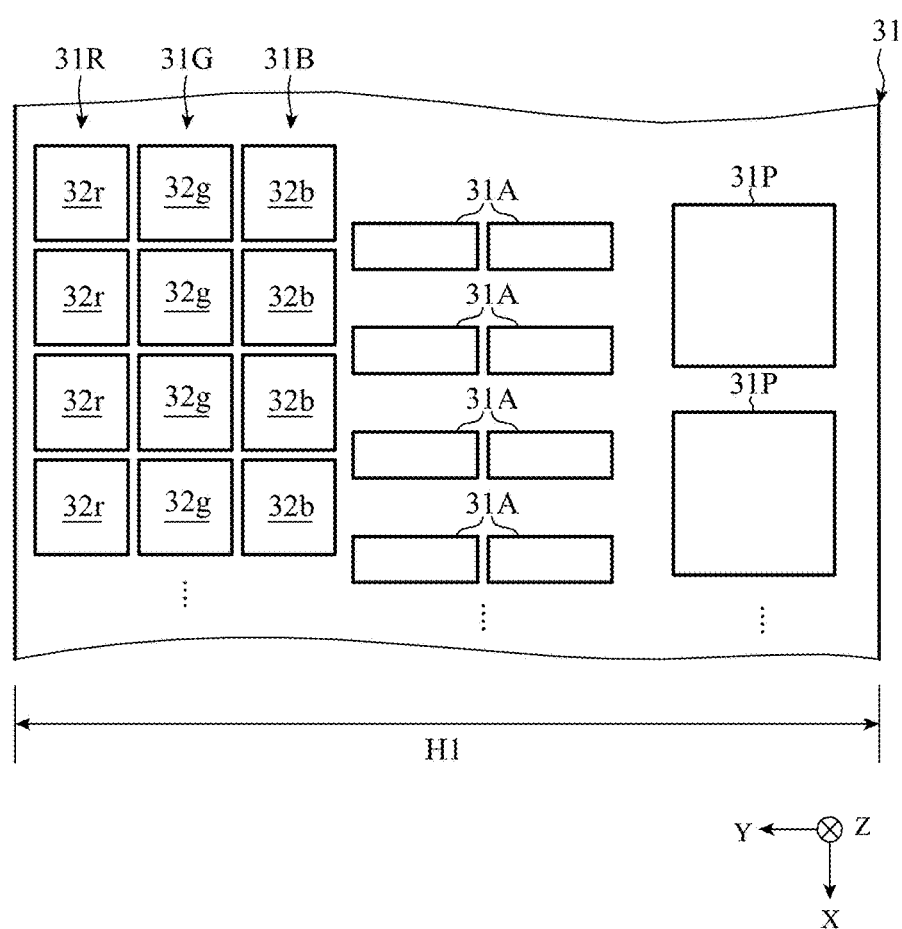
FIG. 7 is a schematic diagram illustrating an example of a main configuration of an imaging unit of the first embodiment.

Next, a configuration of the imaging unit 31 will be described. FIG. 7 is a schematic diagram illustrating an example of the main configuration of the imaging unit 31.

As illustrated in FIG. 7, the imaging unit 31 includes a red line sensor 31R including light-sensitive pixels 32r arrayed in a line along the main scanning direction X on a substrate, a green line sensor 31G including light-sensitive pixels 32g that are arrayed in a line along the main scanning direction X, and a blue line sensor 31B including light-sensitive pixels 32b that are arrayed in a line along the main scanning direction X. The red line sensor 31R, the green line sensor 31G, and the blue line sensor 31B are arranged at the focal position of the microlens array 33. The red line sensor 31R, the green line sensor 31G, and the blue line sensor 31B can be configured by solid-state imaging elements such as complementary metal-oxide semiconductor (CMOS) image sensors or charge-coupled device (CCD) image sensors. The imaging unit 31 further has color filters for generating a color image. That is, the red line sensor 31R has a red color filter that transmits only light in the red wavelength region (red spectrum), the green line sensor 31G has a filter that transmits only light in the green wavelength region (green spectrum), and the blue line sensor 31B has a blue filter that transmits only light in the blue wavelength region (blue spectrum).

The imaging unit 31 further includes peripheral circuits 31A and 31P for applying analog signal processing to detection outputs of the red line sensor 31R, the green line sensor 31G, and the blue line sensor 31B on the same substrate. Each of the peripheral circuits 31A may include a signal processing circuit such as a control circuit for controlling the operation of the red line sensor 31R, the green line sensor 31G, and the blue line sensor 31B, a sample hold circuit for sampling and outputting instantaneous values of the detection outputs, and a signal amplifier circuit. Moreover, each of the other peripheral circuits 31P may include a signal processing circuit for processing analog outputs of the peripheral circuits 31A such as a differential amplifier circuit and an A/D converter.

A peripheral circuit 31P of the imaging unit 31 outputs a digital signal obtained as a result of signal processing to the image signal processor 40 via the sensor substrate 30 and a signal transmission path (e.g. a cable) in FIG. 1. By applying image processing to output signals of the imaging unit 31, the image signal processor 40 can generate captured image signals representing a two-dimensional image on the surface to be scanned of the target object 2. A hardware configuration of the image signal processor 40 can be implemented by a computer with a built-in central processing unit (CPU). Alternatively, a hardware configuration of the image signal processor 40 may be implemented by a large scale integrated circuit (LSI) such as a digital signal processor (DSP), an application specific integrated circuit (ASIC), or an field-programmable gate array (FPGA).

The imaging unit 31 of the present embodiment has three line sensors 31R, 31G, and 31B, although no limitation thereto is intended. Instead of the three line sensors 31R, 31G, and 31B and the peripheral circuits 31A and 31P corresponding thereto, one line sensor and peripheral circuits corresponding thereto may be adopted.

Figure 8A:
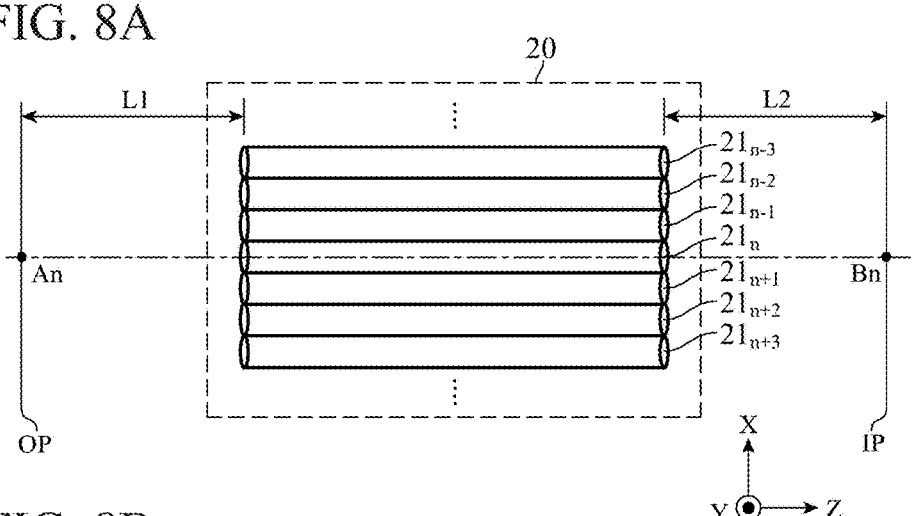
FIG. 8A is a diagram schematically illustrating a rod lens array of the first embodiment.
Figure 8B:
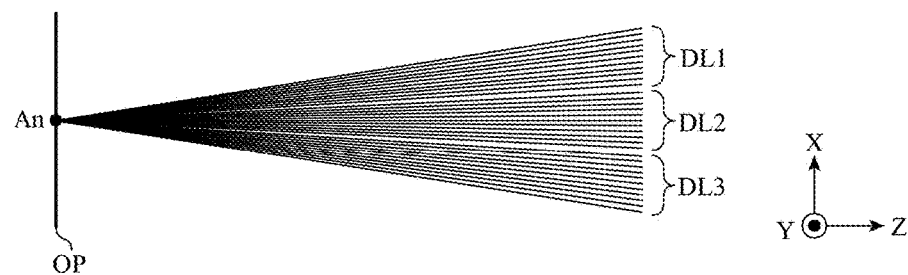
FIG. 8B is a diagram illustrating a groups of rays propagated toward the rod lens array.
Figure 8C:
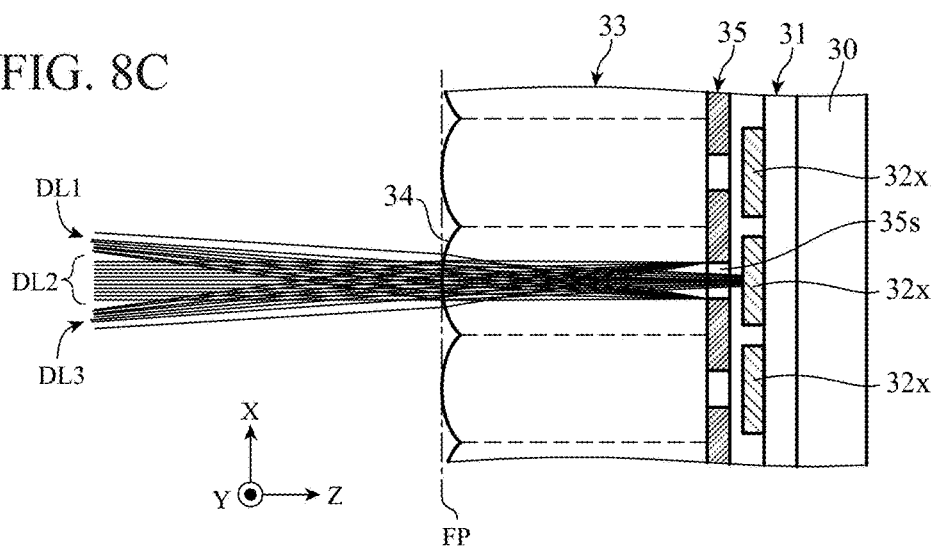
FIG. 8C is a diagram schematically illustrating a configuration in the vicinity of an image-forming plane where the groups of rays reaches.

The configuration of the above-described image capturing device 1 will be described in more detail. FIG. 8A is a diagram schematically illustrating the rod lens array 20. The rod lens array 20 illustrated in FIG. 8A condenses light flux propagated from one point An on the object plane OP to a point Bn on the image-forming plane IP. Point An and point Bn are points on the optical axis of the rod lens $21_n$. As have described with reference to FIG. 3, the rod lens $21_n$ and the adjacent rod lenses $21_{n-1}$ and $21_{n+1}$ both include point An in the field of view thereof. Therefore, as illustrated in FIG. 8B, light flux propagated from point An includes a groups of rays DL1 propagated toward an incident surface of the rod lens $21_{n-1}$, a groups of rays DL2 propagated toward an incident surface of the rod lens $21_n$, and a groups of rays DL3 propagated toward the incident surface of the rod lens $21_{n+1}$. FIG. 8C is a diagram schematically illustrating a configuration of the vicinity of point Bn on the image-forming plane IP where the groups of rays DL1, DL2, and DL3 reach.

As illustrated in FIG. 8C, a microlens 34 of the microlens array 33 is arranged at the focal position FP of the rod lens array 20. The imaging unit 31 is provided on the sensor substrate 30. Between a light-sensitive pixel 32x (any one of the light-sensitive pixels 32r, 32g, and 32b) of the imaging unit 31 and the microlens array 33, the light shielding pattern 35 having an opening 35s facing the light-sensitive pixel 32x is formed. An opening 35s of the light shielding pattern 35 is formed at such a position as to transmit the group of rays DL2 incident at an incident angle less than a predetermined limit angle (that is, an incident angle within the limited angle range), among the groups of rays DL1, DL2, and DL3 incident on the microlens array 33. Therefore, only the groups of rays DL2 passed through the rod lens $21_n$ is condensed by the microlens 34 and then enters the light-sensitive pixel 32x. On the other hand, the groups of rays DL1 and DL3 passed through the rod lenses $21_{n-1}$ and $21_{n+1}$ adjacent to the rod lens $21_n$ are shielded by the light shielding pattern 35 after being condensed by the microlens 34. Therefore, the groups of rays DL1 and DL3 do not reach the light-sensitive pixel 32x.

The light shielding pattern 35 is arranged at the focal position of the microlens array 33 and thus can shield a part of light condensed by the microlens array 33. The thickness of the light shielding pattern 35 is small enough (for example, several micrometers) to be negligible compared with the focal length (for example, about 100 μm) of the microlens array 33, and the light shielding pattern 35 and the light-sensitive pixels 32x of the imaging unit 31 are close to each other. Therefore, it can be said that the effective light-sensitive regions (regions for receiving light used for forming a captured image) of the light-sensitive pixels 32x are arranged substantially at the focal position of the microlens array 33.

Figure 9:
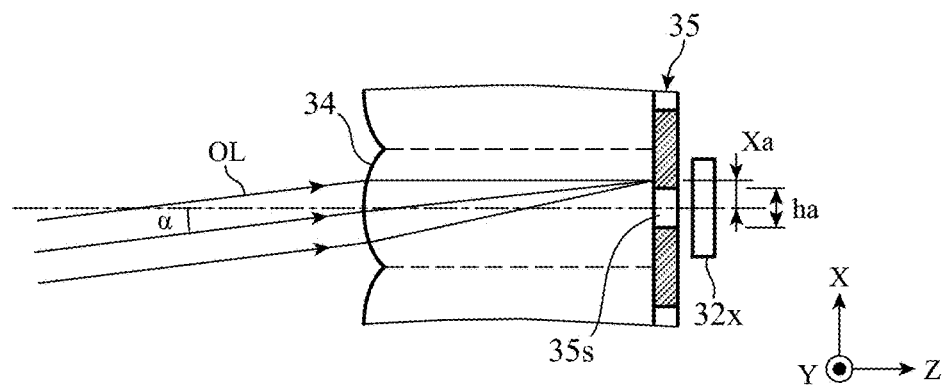
FIG. 9 is a diagram schematically illustrating an optical path of light flux incident on a microlens of the first embodiment.

FIG. 9 is a diagram schematically illustrating the optical path of light flux OL incident on the microlens 34. Now let an incident angle of the light flux OL on the microlens 34 (that is, an angle formed by the light flux OL and a normal line of the image-forming plane IP) be α. The microlens 34 condenses the light flux OL at the position of the light shielding pattern 35 by the positive refractive power. The condensing position (distance in the main scanning direction X from the central axis of the microlens 34, that is, the optical axis) Xa is expressed by the following equation (2):

$$Xa = f_M \times \tan \alpha. \quad (2)$$

Here, $f_M$ represents the focal length of the microlenses 34.

When parallel light having various incident angles α is incident on a microlens 34, a distribution of light quantity corresponding to the incident angles α is obtained on the focal plane of the microlenses 34. Therefore as illustrated in FIG. 9, assuming the opening width of an opening 35s in the main scanning direction X is ha, only light rays an absolute value |α| of the incident angle α of which satisfying the following inequality (3) pass through the opening 35s and is received by a light-sensitive pixel 32x:

$$\tan|\alpha| < ha/(2 \times f_M). \quad (3)$$

Since the light-sensitive pixel 32x and the opening 35s are close to each other in the Z axis direction, the opening width ha is substantially equal to the width (hereinafter also referred to as "light reception width") of the effective light-sensitive region of the light-sensitive pixel 32x in the main scanning direction X. The light shielding pattern 35 is configured so as to shield light rays incident at incident angles larger than or equal to a limit angle $\alpha_L$ satisfying the following equation (3e) among light rays incident on the microlens array:

$$\tan \alpha_L = ha/(2 \times f_M). \quad (3e)$$

From the above equation (3e), the limit angle $\alpha_L$ is expressed by the following expression (3f):

$$\alpha_L = \text{Arctan}[ha/(2 \times f_M)]. \quad (3f)$$

Since the light-sensitive pixel 32x is arranged immediately below the opening 35s, the light shielding pattern 35 can limit light rays entering the effective light-sensitive region of the light-sensitive pixel 32x to light rays close to the central axis of the microlens 34 by shielding light rays such that the above expression (3) is satisfied. Therefore, it is possible to obtain a similar effect as the effect of increasing the depth of field by narrowing the opening in an ordinary monocular refractive lens optical system.

In an optical system for forming one image by superimposing a plurality of erect equal-magnification images like a close contact image sensor using a rod lens array in the related art, it is difficult to improve the depth of field due to the following two items P1 and P2.

Item P1: It is physically difficult to insert a diaphragm at the optimum position in a rod lens.

Item P2: Overlapping positions of images superimposed by adjacent rod lenses are shifted from each other during being defocused.

Particularly, the item P2 is a problem derived from the difficulty in the related art in limiting the range of field of view of each of the rod lenses.

In the present embodiment, contrarily it is possible to improve the depth of field which is difficult in the conventional technique. Hereinafter, effects of the present embodiment will be described in detail in consideration of the mechanism of image deterioration (FIG. 4 and FIG. 5) during being defocused described above.

For ease of explanation, it is assumed that the image resolution is 600 dpi (that is, resolution of 42.3 μm per pixel). As for the rod lens array 20, it is assumed that the rod lenses $21_1$ to $21_N$ each having a diameter of 0.6 mm are arrayed along the main scanning direction X at a pitch of 0.6 mm. Furthermore, it is assumed that a distance L1 from the object plane OP to the incident surface of the rod lens array 20 is 5.1 mm and that a distance L2 from the emitting surface of the rod lens array 20 to the image-forming plane IP is also 5.1 mm. It is assumed that each of the rod lenses has a full angle of a field of view of 20 degrees in the main scanning direction X (half angle of field of view β=10°). That is, light rays having entered the rod lens array 20 at an angle exceeding the range of incident angle of −10° to +10° cannot be propagated in the rod lenses $21_1$ to $21_N$. Since L1=5.1 mm for the half angle of field of view β=10°, the visual field length of a single rod lens on the object plane OP is about 1.8 mm (=2×5.1×tan 10°).

In addition, since the ratio of a visual field length of 1.8 mm to the pitch of 0.6 mm of the rod lenses $21_1$ to $21_N$ is 3, in the case where the microlens array 33 of the present embodiment does not exist, as illustrated in FIG. 3, a point on the object plane OP is included in the field of view of three rod lenses.

It is further assumed that the microlens array 33 is made of a transparent resin material having a refractive index of n=1.59, for example, and a lens surface of each of the microlenses 34 has a curvature of R=37 μm in the main scanning direction X. It is assumed that the microlenses 34 each have a thickness of Ht=100 μm and are arrayed along the main scanning direction X at an array pitch of Pt=42.3 μm.

In this case, a focal length $f_M$ of one microlens 34 is calculated as follows:

$$f_M = R/(n-1) = 62.9 \text{ μm}.$$

The focal length in a medium having a refractive index n (=1.59) is about 100 μm (=n×$f_M$). Therefore, the parallel light flux OL as illustrated in FIG. 9 is focused on the bottom surface of the microlens array 33. The light shielding pattern 35 having openings 35s is arranged in close contact with the bottom surface of the microlens array 33. An array pitch Pt of the openings 35s is 42.3 μm. The center of an opening 35s is on the central axis of each of the microlenses 34.

Figure 10:
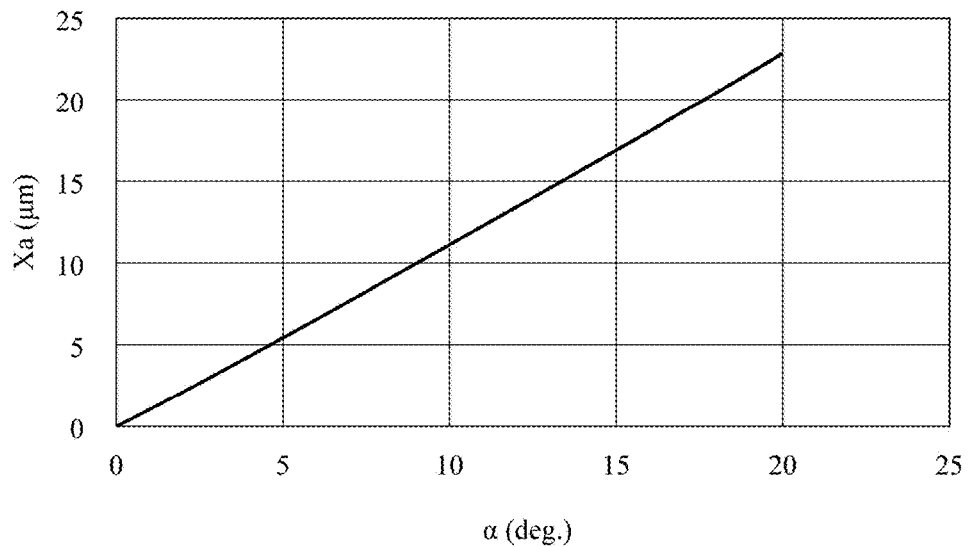
FIG. 10 is a graph illustrating a relationship between the incident angle of parallel rays incident on a microlens and the condensing position of these parallel light rays.

The effect that the depth of field is increased under the above conditions will be described below. FIG. 10 is a graph illustrating the relationship between the incident angle α of parallel rays incident on the microlens 34 and a condensing position Xa of these parallel light rays. This graph was created using the above equation (2). Since the half angle of field of view β of each of the rod lenses is 10°, an incident angle α of light rays incident on the microlens 34 is also 10° at the maximum from $\varphi_{in} = \varphi_{out}$ of the above equation (1). The position at which the light rays of an incident angle of 10° reach on the surface of the light shielding pattern 35 is Xa=11 μm according to the graph of FIG. 10. Here, in order for the light shielding pattern 35 to shield light rays having a large incident angle α, it is necessary that the opening width ha of the openings 35s at least satisfies the relationship of the following inequality (4):

$$ha/2 < Xa. \quad (4)$$

That is, it is necessary that the following inequality (5) holds:

$$ha/2 < f_M \times \tan \beta. \quad (5)$$

From the inequality (5) and the above equation (3f), the following inequality (5A) is derived:

$$\alpha_L = \text{Arctan}[ha/(2 \times f_M)] < \beta. \quad (5A)$$

Figure 11:
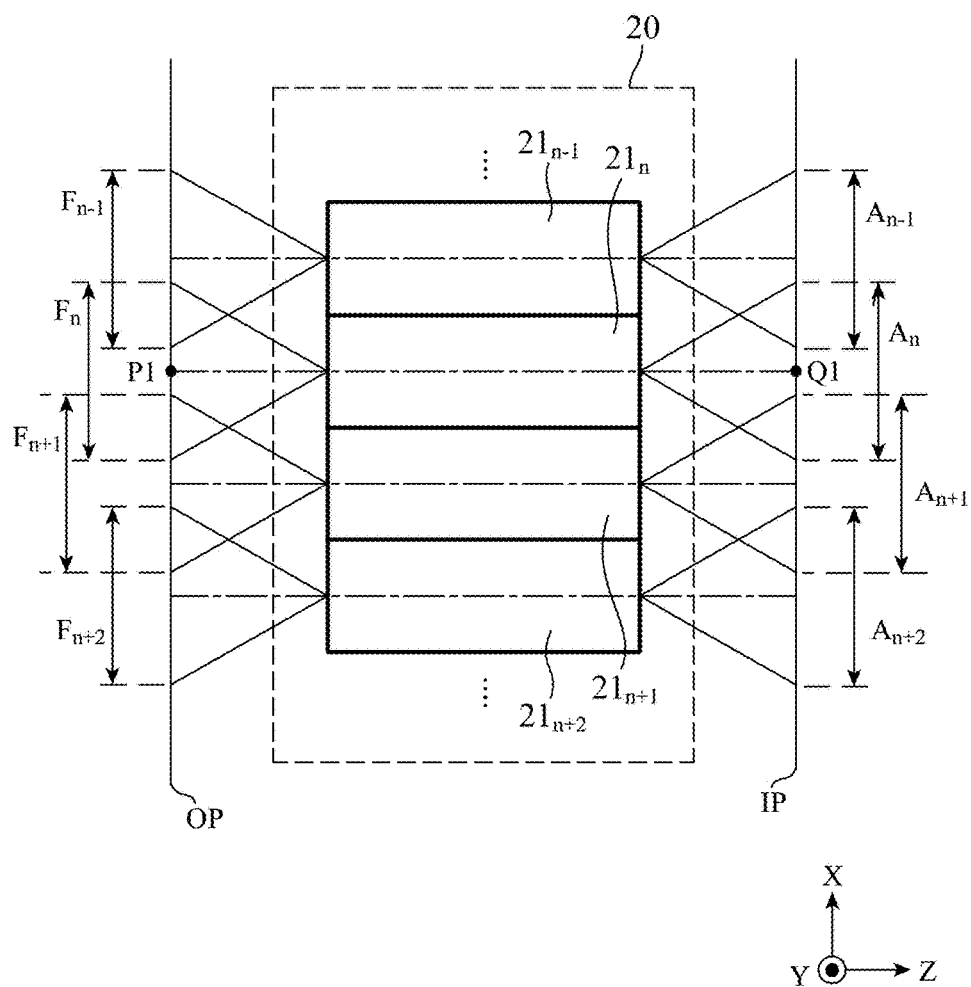
FIG. 11 is a diagram schematically illustrating a field of view and an image-forming area of a plurality of rod lenses.

Now, since ha/2=5 μm and $f_M$=62.9 μm, $\alpha_L$=4.5°, which satisfies the inequality (5A). Therefore, out of the light rays having entered the rod lens array 20, light rays incident at an incident angle less than or equal to 10° pass through the rod lens array 20 and enter the microlens array 33. Furthermore, out of light rays incident on the microlens array 33, light rays having an incident angle within the range of 4.5° to 10° are absorbed by a light shielding region of the light shielding pattern 35, and only light rays incident at an incident angle α of less than 4.5° reach the imaging unit 31. Therefore, by inserting the microlens array 33 and the light shielding pattern 35 between the rod lens array 20 and the imaging unit 31, the viewing angle of the rod lens array 20 which originally had the viewing angle of 10° can be limited to 4.5°. This narrows an overlapping range of the field of view between adjacent rod lenses. FIG. 11 is a diagram schematically illustrating fields of view $F_{n-1}$, $F_n$, $F_{n+1}$, and $F_{n-2}$ of the rod lens $21_{n-1}$, $21_n$, $21_{n+1}$, and $21_{n+2}$ included in the rod lens array 20 and image-forming areas $A_{n-1}$, $A_n$, $A_{n+1}$, and $A_{n+2}$. Comparison with the case illustrated in FIG. 3 shows that overlapping ranges of the fields of views $F_{n-1}$, $F_n$, $F_{n+1}$, and $F_{n+2}$ are narrower due to the presence of the microlens array 33 and the light shielding pattern 35.

As described above, the main factor of deterioration of the depth of field is the positional shift between images formed by adjacent rod lenses. When the field of view of each of the rod lenses becomes smaller, an incident angle of the outermost light ray on the image-forming plane IP becomes smaller, and a positional shift of an image when defocused becomes smaller. Therefore, the image capturing device 1 of the present embodiment can effectively suppress degradation of an image when defocused by restricting the field of view of the rod lens array 20, thereby enabling to increase the depth of field.

Figure 12A:
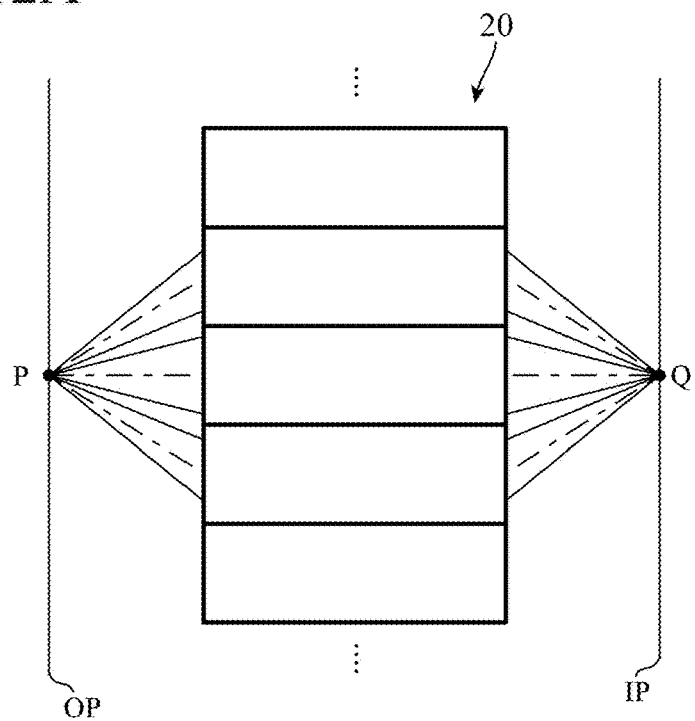
FIGS. 12A and 12B are diagrams schematically illustrating optical paths of light flux passing through a rod lens array when there are neither microlens array nor a light shielding pattern.
Figure 12B:
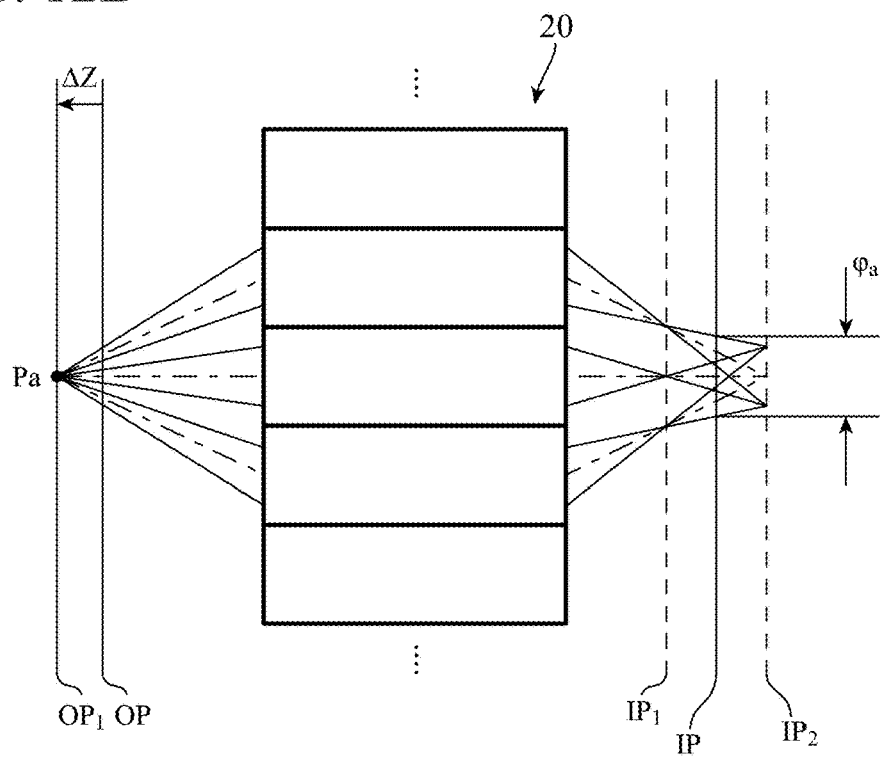

FIGS. 12A and 12B are diagrams schematically illustrating optical paths of light flux passing through the rod lens array 20 when there are neither the microlens array 33 nor the light shielding pattern 35. FIG. 12A illustrates the optical path in focus, and FIG. 12B illustrates the optical path defocused when an object plane $OP_1$ is formed at the position moved by $-\Delta Z$ in the Z axis direction from the object plane OP in focus. Since each of the rod lenses has a wide field of view when in focus, as illustrated in FIG. 12A, the light flux incident from point P on the object plane OP passes through three rod lenses in the rod lens array 20 and then is condensed to point Q on an image-forming plane IP. As illustrated in FIG. 12B, light flux incident from point Pa on the object plane $OP_1$ passes through three rod lenses in the rod lens array 20 when defocused and then is condensed on three points on an image-forming plane $IP_1$. Thereafter, three rays of light flux that have passed through the image-forming plane $IP_1$ reach the image-forming plane IP in focus and then reach an image plane $IP_2$ at a position apart from the image-forming plane IP by $+\Delta Z$. In the example of FIG. 12B, three images are formed on the image-forming plane IP in focus, and since the positions of these three images are greatly shifted from each other, a significant blur is generated. The amount of blur $\varphi_a$ is formed in a range including the outermost light rays of the three rays of light flux.

Figure 13A:
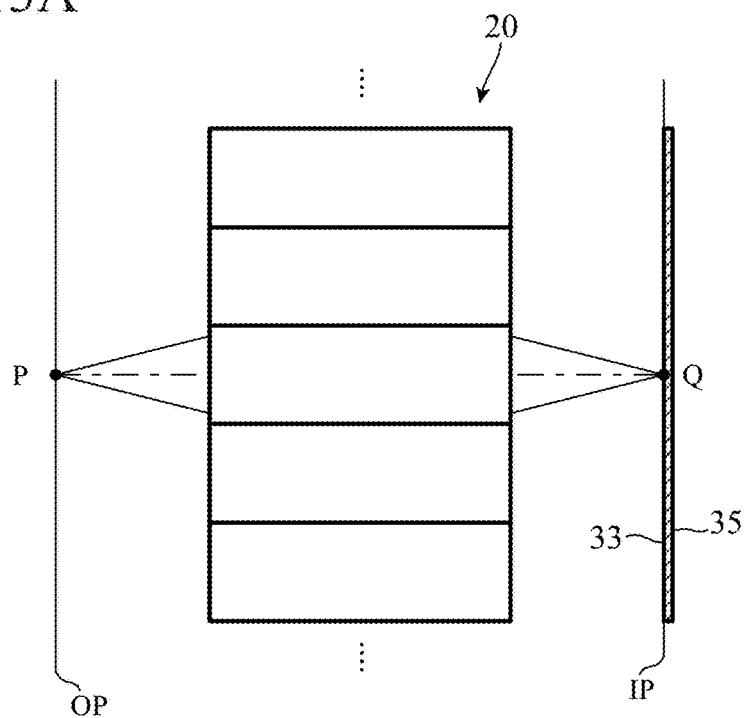
FIGS. 13A and 13B are diagrams schematically illustrating optical paths of light flux passing through a rod lens array when there are a microlens array and a light shielding pattern.
Figure 13B:
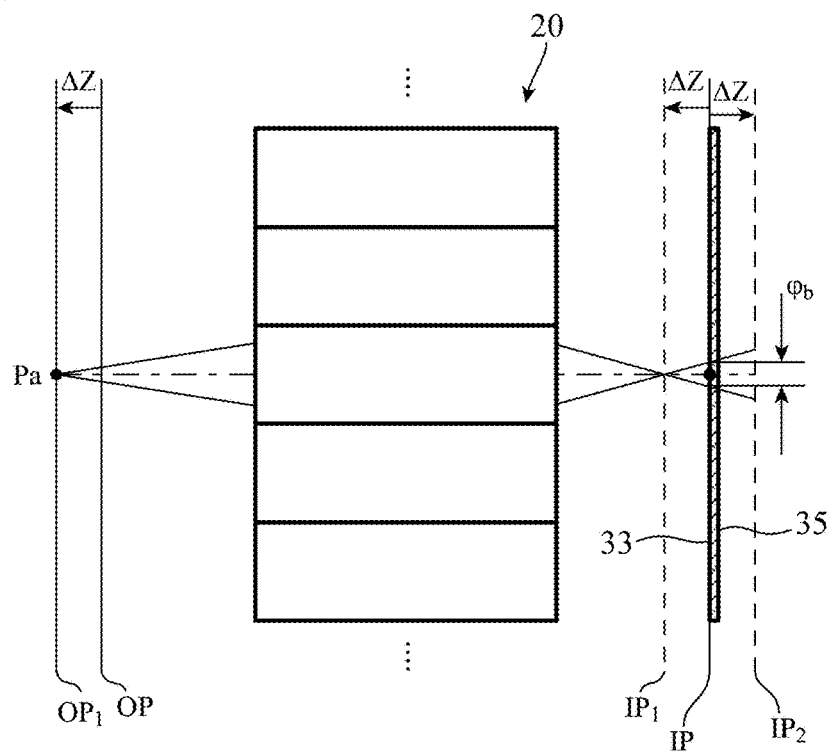

On the other hand, FIGS. 13A and 13B are diagrams schematically illustrating optical paths of light flux passing through the rod lens array 20 when the microlens array 33 and the light shielding pattern 35 are present. FIG. 13A illustrates the optical path in focus, and FIG. 13B illustrates the optical path defocused when an object plane $OP_1$ is formed at the position moved by $-\Delta Z$ in the Z axis direction from the object plane OP in focus. Since each of the rod lenses has a narrow field of view when in focus, as illustrated in FIG. 13A, the light flux incident from point P on the object plane OP passes through one rod lens in the rod lens array 20 and then is condensed to point Q on an image-forming plane IP. As illustrated in FIG. 13B, light flux incident from point Pa on the object plane $OP_1$ passes through one rod lens in the rod lens array 20 when defocused and then is condensed on one point on an image-forming plane $IP_1$. Thereafter, one ray of light flux that have passed through the image-forming plane $IP_1$ reaches the image-forming plane IP in focus and then reaches an image plane $IP_2$ at a position apart from the image-forming plane IP by $+\Delta Z$. In the example of FIG. 13B, since one image is formed on the image-forming plane IP in focus, the amount of blur $\varphi_b$ is smaller as compared to the amount of blur $\varphi_a$ in the case of FIG. 12B.

Figure 14:
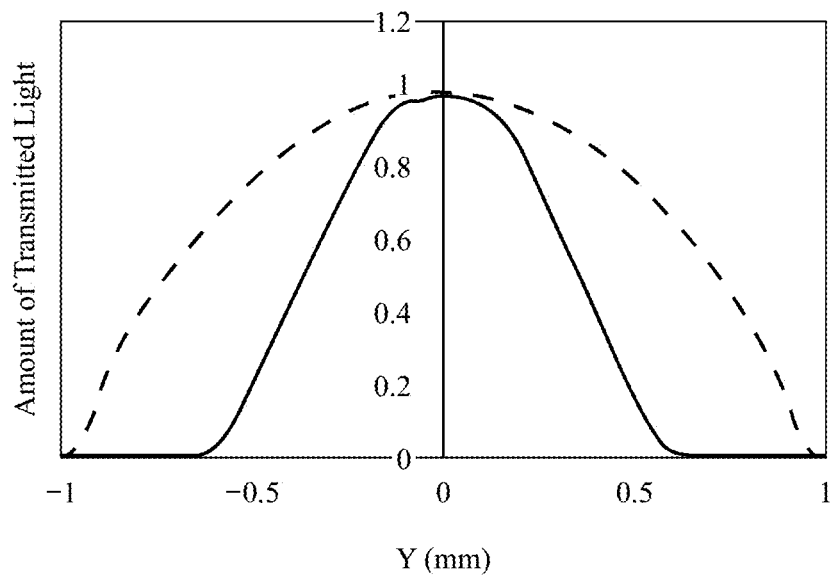
FIG. 14 is a graph illustrating an example of a distribution of light quantity on an image-forming plane obtained by simulation calculation.
Figure 15:
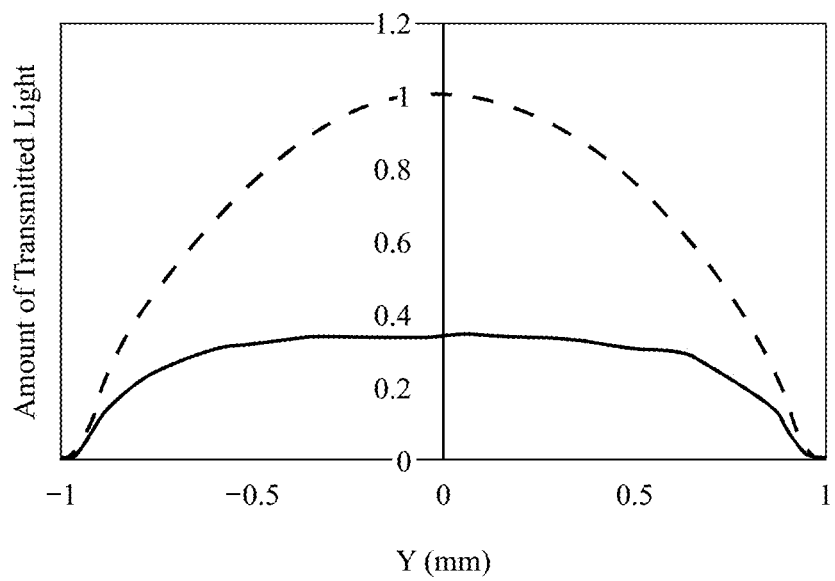
FIG. 15 is a graph illustrating another example of a distribution of light quantity on an image-forming plane obtained by simulation calculation.

Next, effects of the present embodiment will be described on the basis of simulation calculation. FIGS. 14 and 15 are graphs illustrating a distribution of light quantity on an image-forming plane obtained by simulation calculation. In the graphs of FIGS. 14 and 15, the horizontal axis represents the position (unit: mm) from a point (Y=0) on the optical axis of a single rod lens, and the vertical axis represents the amount of transmitted light. This simulation was performed on each of the following example and a first and a second comparative examples. The amount of transmitted light on the vertical axis in the graphs of FIGS. 14 and 15 is normalized such that the amount of transmitted light at Y=0 in the case of the first comparative example equals 1.

The example includes a single rod lens, a white surface light source arranged on a focal plane of the rod lens on the object side (object plane), a microlens array 33 arranged on an image-forming plane of the rod lens, an imaging unit 31 arranged near the focal position of the microlens array 33, and a light shielding pattern 35 arranged between the imaging unit 31 and the microlens array 33. Here, an opening 35s having a slit width of 10 µm was used.

The first comparative example has a configuration in which the microlens array 33 and the light shielding pattern 35 are removed from the configuration of the example. The second comparative example has a configuration of the first comparative example in which a diaphragm pf the opening is further arranged on an emitting end surface of the rod lens.

The distribution of light quantity represented by a solid line in the graph of FIG. 14 illustrates a simulation result for the example. The distribution of light quantity indicated by broken lines in the graphs of FIGS. 14 and 15 illustrates a simulation result for the first comparative example, and the distribution of light quantity indicated by a solid line in the graph of FIG. 15 illustrates a simulation result for the second comparative example. Since a rod lens transfers an image at an equal magnification, the width of the distribution of light quantity represents the range of field of view. According to FIGS. 14 and 15, it is clear from the simulation result of the first comparative example that the original range of field of view of the rod lens is about −1 mm to +1 mm.

According to FIG. 14, the range of field of view of the example has a width of about −0.5 mm to +0.5 mm, and the field of view is limited to about a half as compared with the first comparative example. In addition, it is clear that there is almost no attenuation in the amount of light near the optical axis (near Y=0 mm) and that the field of view is efficiently limited.

On the other hand, according to FIG. 15, the range of field of view of the second comparative example is not significantly different from the range of field of view of the first comparative example. Moreover, the amount of light attenuates over the entire field of view. This means that arranging the diaphragm of the opening on the emitting end surface of the rod lens only attenuates light rays of all the image heights evenly and that the effect of limiting the field of view can hardly be obtained.

Figure 16:
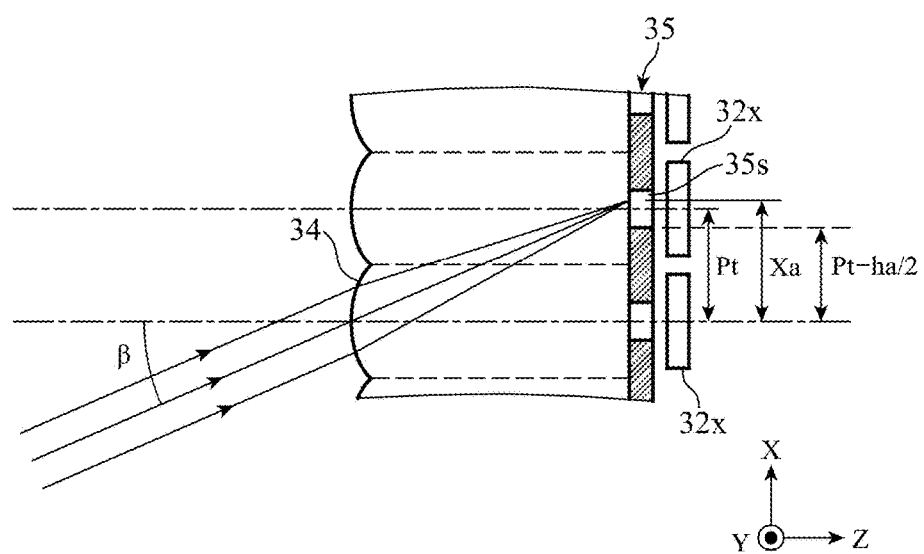
FIG. 16 is a diagram schematically illustrating an optical path of light flux incident on a microlens of the first embodiment.

Next, with reference to FIG. 16, a configuration that enables prevention of interference of light rays between adjacent microlenses 34 and 34 will be described. FIG. 16 is a diagram schematically illustrating the optical path of light flux incident on microlenses 34.

Suppose the focal length of a single microlens 34 is, for example, $f_M$=300 µm. Here, an arrival position of the outermost light ray in the half angle of field of view β=10° is $X_a = f_M \times \tan\beta = 52$ μm. An interval Pt between the adjacent microlenses 34 and 34 is 42.3 μm. Therefore, as illustrated in FIG. 16, there are cases where light rays incident on a certain microlens 34 may reach a light-sensitive pixel 32x immediately below the other microlens 34 adjacent thereto and thereby become stray light to cause interference. When such interference occurs, inserting the microlens array 33 may further cause the image to be blurred and deteriorate the image quality. The condition for preventing such interference is as expressed in the following inequality (6):

$$f_M \times \tan\beta < Pt - ha/2. \qquad (6)$$

Here, Pt is the array pitch of the microlenses 34. Where Pt=42.3 μm and ha=10 μm, the condition of $f_M < 211$ μm is required. In fact, unless the outermost light ray of the light flux incident on a certain microlens 34 goes beyond a boundary between the certain microlens 34 and another microlens 34 adjacent thereto, further stray light is unlikely to occur. Therefore, it is more desirable that the condition of the following inequality (7) is satisfied:

$$f_M \times \tan\beta < Pt/2. \qquad (7)$$

Where Pt=42.3 μm and β=10°, the condition of $f_M < 120$ μm is derived.

As described above, in the image capturing device 1 of the first embodiment, the microlens array 33 and the light shielding pattern 35 are arranged between the emitting surface of the rod lens array 20 and the imaging unit 31. The light shielding pattern 35 shields light rays incident at an incident angle larger than or equal to a limit angle (that is, an incident angle outside a limited angle range) and condensed by the microlens array 33, among light rays incident on the microlens array 33. The light shielding pattern 35 does not shield light before being condensed by the microlens array 33 but shields light condensed by the microlens array 33, and thus the amount of shielding is small. In addition, an effective light-sensitive region of a light-sensitive pixel in the imaging unit 31 receives only light incident at an incident angle less than the limit angle (that is, an incident angle within the limited angle range), among light rays incident on the microlens array 33. Therefore, it is possible to increase the depth of field while reduction in the amount of received light of the imaging unit 31 is suppressed.

Furthermore, with the relational expression of the above inequality (6) or (7) satisfied, interference of light rays between adjacent microlenses 34 and 34 can be prevented, and thus the image quality of a captured image can be improved.

Second Embodiment

Figure 17:
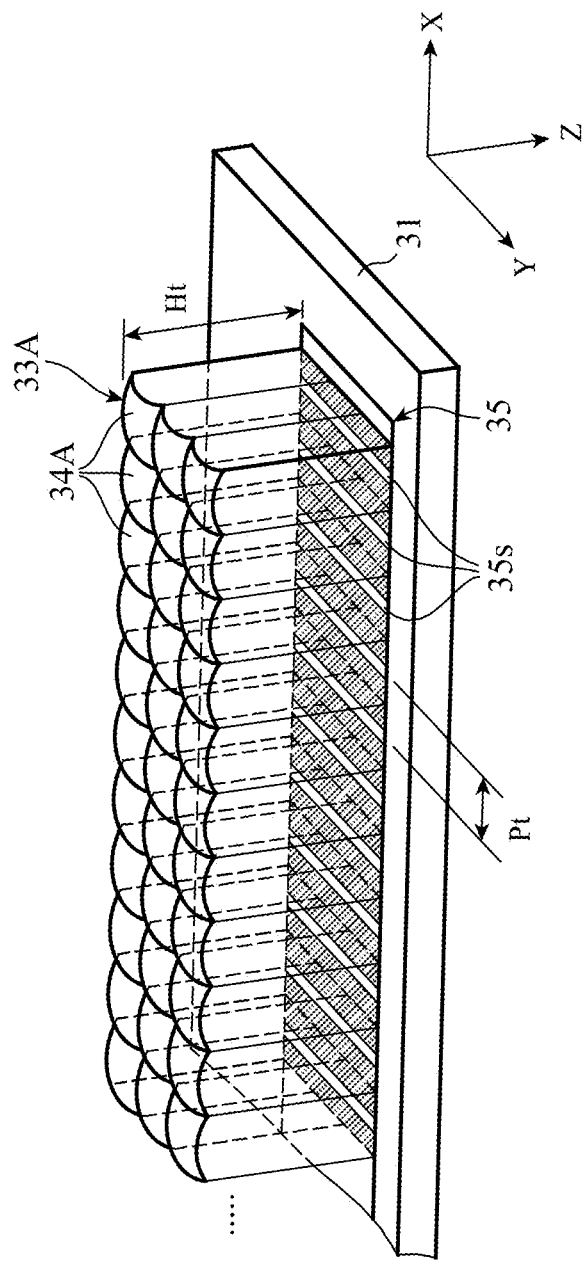
FIG. 17 is a perspective view illustrating a schematic configuration example of a microlens array of a second embodiment according to the present invention.

Next, a second embodiment according to the present invention will be described. A lens surface of a micro condenser lens 34 of the first embodiment has a non-zero curvature only in the main scanning direction X. A lens surface of a micro condenser lens of the present embodiment has a non-zero curvature in both the main scanning direction X and the subscanning direction Y. FIG. 17 is a perspective view illustrating a schematic configuration example of a microlens array 33A according to a second embodiment. A configuration of an image capturing device of the present embodiment is the same as that of the image capturing device 1 of the first embodiment except that the microlens array 33A illustrated in FIG. 17 is included instead of the microlens array 33 of the first embodiment.

As illustrated in FIG. 17, the microlens array 33A of the present embodiment includes three rows of micro condenser lenses 34A that are arrayed along the main scanning direction X. These micro condenser lenses 34A (hereinafter also referred to as "microlenses 34A") includes a row comprised of a micro condenser lens group for condensing incident light on the light-sensitive pixels 32r of the red line sensor 31R illustrated in FIG. 7, a row comprised of a micro condenser lens group for condensing incident light on the light-sensitive pixels 32g of the green line sensor 31G, and a row comprised of a micro condenser lens group for condensing incident light on the light-sensitive pixels 32b of the blue line sensor 31B.

In addition, each of the microlenses 34A has a lens surface arranged at the focal position of rod lenses $21_1$ to $21_N$. This lens surface has a convex shape having a positive refractive power in the main scanning direction X with respect to light flux incident from a rod lens array 20 and a positive refractive power also in the subscanning direction Y. Therefore, the lens surface has a non-zero curvature in both the main scanning direction X and the subscanning direction Y. Examples of a specific curved surface shape of such a microlens 34A include a spherical lens shape having an optical axis passing through the center of a light-sensitive pixel 32x (any one of the light-sensitive pixels 32r, 32g, and 32b).

Furthermore, an interval (pitch) Pt in the main scanning direction X between top parts of adjacent micro condenser lenses 34A and 34A is constant. Furthermore as illustrated in FIG. 17, the microlens array 33A has a constant thickness Ht in the Z-axis direction (that is, the thickness in the Z-axis direction between a top part of a lens surface of a microlens 34A and the bottom surface of the microlens 34A) like the microlens array 33 of the first embodiment. Such a microlens array 33A can be manufactured using a lens material such as resin or quartz.

Since a lens surface of a microlens 34 of the first embodiment has a cylindrical shape, there is an advantage that fabrication is easier than the lens surface of the present embodiment having a spherical shape. On the other hand, the lens surface of the microlens 34 of the first embodiment has a difference in focal lengths of the main scanning direction X and the subscanning direction Y, and thus there is a difference in optical path lengths of the main scanning direction X and the subscanning direction Y. For example, when the microlens 34 of the first embodiment has the thickness of Ht=100 μm and the refractive index of n=1.59, a difference in the optical path lengths of the main scanning direction X and the subscanning direction Y is calculated as follows:

$$100 \text{ μm}/n = 62.9 \text{ μm}.$$

Therefore, in the microlens 34 of the first embodiment, there is a possibility that the focal positions may deviate by 62.9 μm between the main scanning direction X and the subscanning direction Y. On the other hand, in the case where a lens surface has the same positive refractive power in the main scanning direction X and the subscanning direction Y as in the micro condenser lens 34A of the present embodiment, it is possible to make the focal positions in the main scanning direction X and the subscanning direction Y to coincide with each other. Therefore, a finer captured image can be generated during being defocused as compared with the case of the first embodiment.

Note that, although a spherical lens has been cited as a preferred example of the microlens 34A of the present embodiment, it is not always necessary to adopt a spherical lens. An optical lens (for example, an aspheric lens) having a lens shape other than a spherical surface may be adopted as long as the lens shape allows focal positions in the main scanning direction X and the subscanning direction Y to coincide with each other.

Third Embodiment

Next, a third embodiment according to the present invention will be described. The first embodiment is the image capturing device 1 of a rod lens array type using the rod lens array 20 as an imaging optical system for forming an erect equal-magnification image. The present embodiment is an image capturing device of a refractive lens array type using a plurality of refractive lens groups as an imaging optical element group instead of the rod lens array 20. A configuration of the image capturing device of the present embodiment is the same as that of the image capturing device 1 of the first embodiment except that the plurality of refractive lens groups is included instead of the rod lens array 20.

Figure 18A:
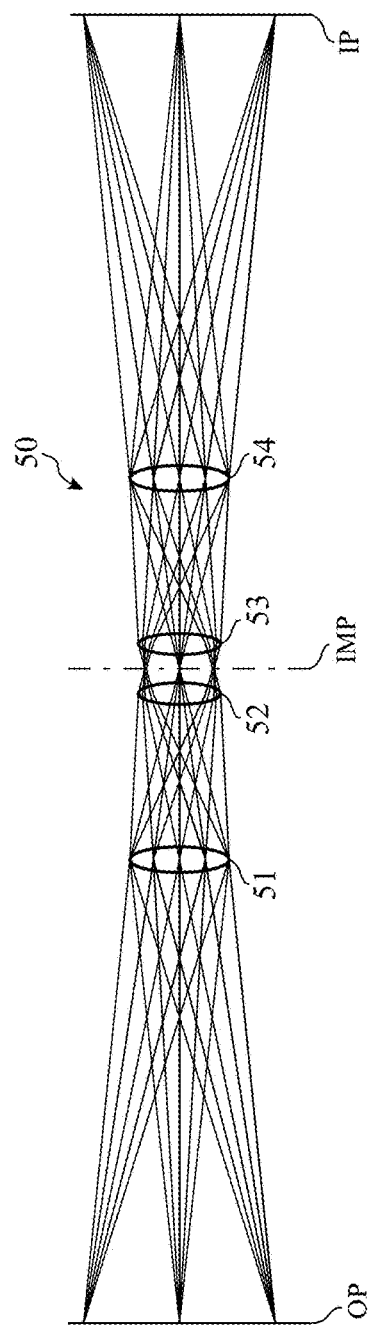
FIG. 18A is a diagram illustrating an example of one imaging optical element forming an imaging optical system of a third embodiment according to the present invention.
Figure 18B:
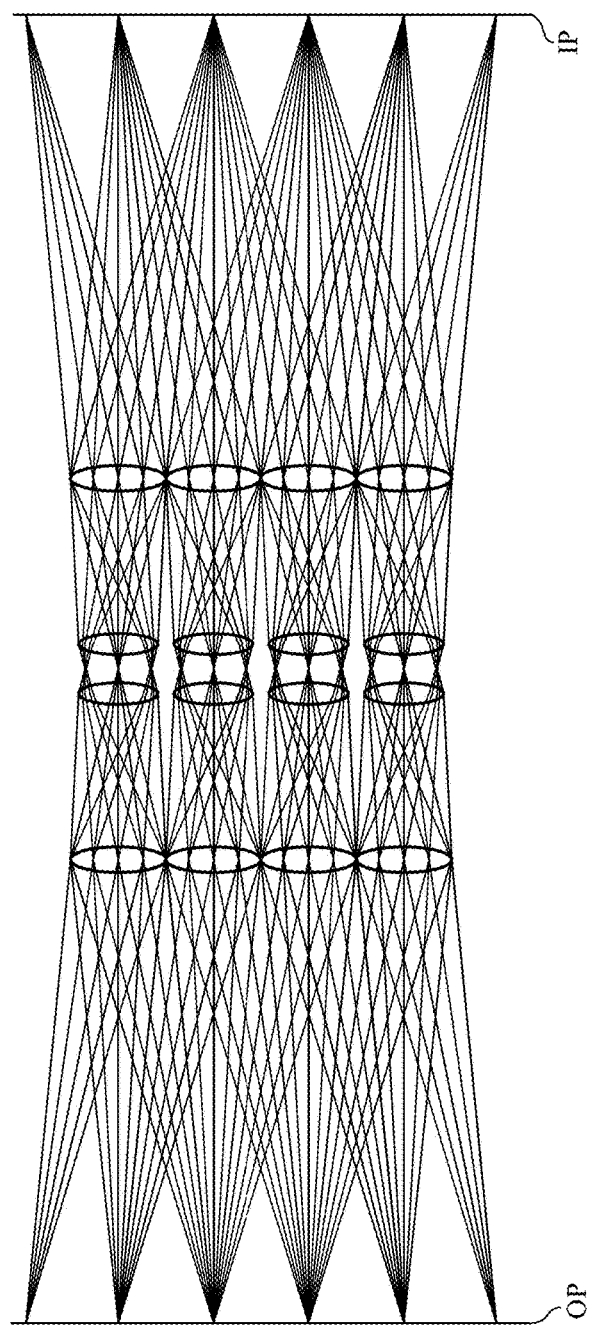
FIG. 18B is a diagram illustrating an example of the imaging optical system of the third embodiment.

FIG. 18A is a diagram illustrating an example of one imaging optical element 50 included in an imaging optical system of the third embodiment. The imaging optical element 50 includes four refractive lenses 51, 52, 53, and 54. As illustrated in FIG. 18A, light flux incident from a plurality of points on an object plane OP forms an inverted reduced image on an intermediate image-forming plane IMP. The imaging optical element 50 forms an erect equal-magnification image on an image-forming plane IP by further increasing and inverting the inverted reduced image. As illustrated in FIG. 18B, by arraying a plurality of such imaging optical elements 50, the imaging optical system of the present embodiment can be configured.

Since the imaging optical system of FIG. 18B has a plurality of imaging optical elements 50 illustrated in FIG. 18A, the plurality of imaging optical elements 50 forms a plurality of erect equal-magnification images superimposed on each other on the image-forming plane IP. The principle of constructing the entire image by superimposing a plurality of erect equal-magnification images in this manner is the same as the principle of the rod lens array 20.

Therefore, like in the case of the first embodiment described above, in the present embodiment a microlens array 33 and a light shielding pattern 35 are arranged between an emitting surface of the imaging optical system of FIG. 18B and an imaging unit 31, the field of view of each of the imaging optical elements 50 can be narrowed. Therefore, it is possible to increase the depth of field while reduction in the amount of received light of the imaging unit 31 is suppressed. Furthermore, with the relational expression of the above inequality (6) or (7) satisfied, interference of light rays between adjacent microlenses 34 and 34 can be prevented, and thus the image quality of a captured image can be improved.

Note that, as can be easily inferred from the above explanation, not only refractive lens groups but also reflective concave mirrors may be included as a component as long as the mirrors are an imaging optical system of a lens array type that allows erect equal-magnification images to overlap. Also in this case, similar effects can be obtained.

Fourth Embodiment

Next, a fourth embodiment according to the present invention will be described. In the case of the first embodiment, as illustrated in FIGS. 8A to 8C, the light shielding pattern 35 is formed at a position such that the groups of rays DL2 incident at an incident angle less than the limit angle $\alpha_L$ is transmitted out of the groups of rays DL1, DL2, and DL3 incident on the microlens array 33. Therefore, only the groups of rays DL2 passed through the rod lens $21_n$ in FIG. 8A is condensed by the microlens 34 and enters the effective light-sensitive region of the light-sensitive pixel 32x. On the other hand, the unnecessary groups of rays DL1 and DL3 that have passed through the rod lenses $21_{n-1}$ and $21_{n+1}$ adjacent to the rod lens $21_n$ are shielded by the light shielding pattern 35 after being condensed by the microlens 34.

Figure 19:
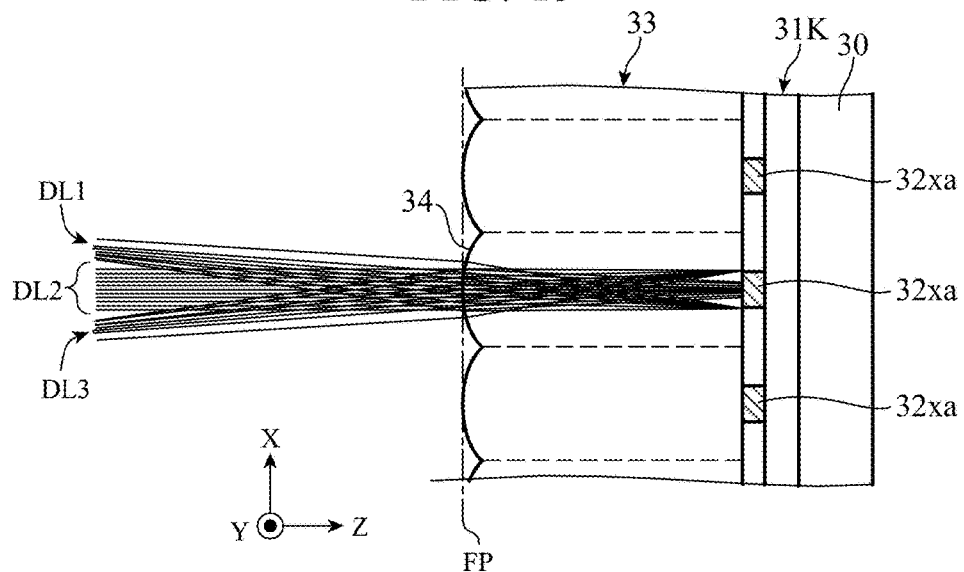
FIG. 19 is a cross-sectional view illustrating a schematic configuration of an imaging unit of a fourth embodiment according to the present invention.

Contrary to this, FIG. 19 is a cross-sectional view illustrating a schematic configuration of an imaging unit 31K of the fourth embodiment. The configuration of an image capturing device of the present embodiment is the same as that of the image capturing device 1 of the first embodiment except that the imaging unit 31K of FIG. 19 is included instead of the light shielding pattern 35 and the imaging unit 31 of the first embodiment. As illustrated in FIG. 19, an effective light-sensitive region of a light-sensitive pixel 32xa of the imaging unit 31K is formed over a range in which only a group of rays DL2 incident at an incident angle less than a limit angle $\alpha_L$ (that is, an incident angle within a limited angle range) is received, among groups of rays DL1, DL2, and DL3 incident on the microlens array 33. Therefore, the groups of rays DL1 and DL3 incident on the microlens array 33 at an incident angle larger than the limit angle $\alpha_L$ (that is, an incident angle outside the limited angle range) are not received by the light-sensitive pixel 32xa.

In this manner, instead of including the light shielding pattern 35 of the first embodiment, the present embodiment is designed to have a narrower light reception width in light-sensitive pixels 32xa in the main scanning direction X. Therefore, similarly to the case of the first embodiment, it is possible to increase the depth of field while reduction in the amount of received light of the imaging unit 31K is suppressed.

Furthermore, compared with the imaging unit 31 of the first embodiment, there is an effect that the size of the imaging unit 31K can be reduced. As a manufacturing method of the imaging unit 31K, a typical example is, for example, a method of forming a large number of imaging unit chips on a single semiconductor substrate (for example, a silicon wafer) by a semiconductor process and then separating these large number of imaging unit chips from each other. Each of the imaging unit chips is used as an imaging unit 31K. A manufacturing method of the imaging unit 31 of the first embodiment is also similar to the manufacturing method of the imaging unit 31K. Therefore, as described above, there is an effect that the number of imaging unit chips manufactured from one semiconductor substrate increases if the light reception width of the effective light-sensitive region of the imaging unit 31K becomes smaller and the light-sensitive area of the imaging unit 31K becomes smaller.

Figure 20:
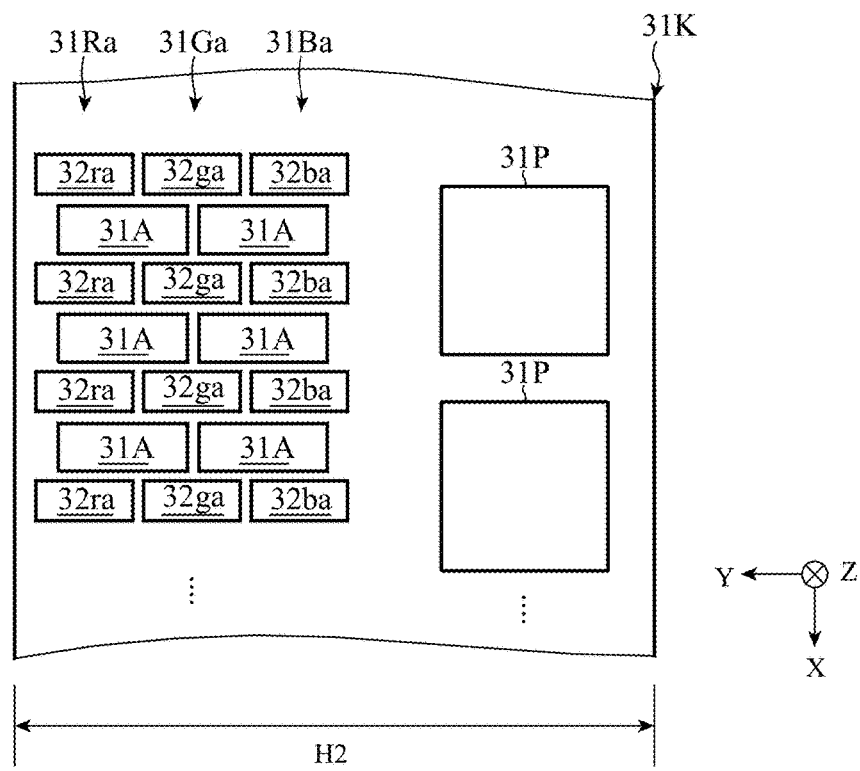
FIG. 20 is a schematic diagram illustrating an example of the main configuration of an imaging unit of the fourth embodiment.

Moreover, since the size of the imaging unit 31K is small, the size of the entire imaging unit 31K in the subscanning direction Y can be reduced. This point will be described below. FIG. 20 is a schematic diagram illustrating an example of the main configuration of the imaging unit 31K of the present embodiment. As illustrated in FIG. 20, the imaging unit 31K includes a red line sensor 31Ra including light-sensitive pixels 32ra that are arrayed in a line along the main scanning direction X on a substrate, a green line sensor 31Ga including light-sensitive pixels 32ga that are arrayed in a line along the main scanning direction X, and a blue line sensor 31B including light-sensitive pixels 32ba that are arrayed in a line along the main scanning direction X. The light-sensitive pixel 32xa illustrated in FIG. 19 is one of the light-sensitive pixels 32ra, 32ga, and 32ba.

In the imaging unit 31K, peripheral circuits 31A and 31A are further formed in a region not receiving light between the light-sensitive pixels 32ra, 32ga, and 32ba and the light-sensitive pixels 32ra, 32ga, and 32ba. The function of a peripheral circuit 31A in FIG. 20 is similar to the function of the peripheral circuit 31A (FIG. 7) of the first embodiment. The imaging unit 31K further includes peripheral circuits 31P for processing analog output of the peripheral circuits 31A. The function of a peripheral circuit 31P is similar to the function of the peripheral circuit 31P (FIG. 7) of the first embodiment.

In the fourth embodiment, since the peripheral circuits 31A are formed in the region not receiving light between the light-sensitive pixels 32ra, 32ga, and 32ba and the light-sensitive pixels 32ra, 32ga, and 32ba, the width H2 of the imaging unit 31K in the subscanning direction Y is smaller than the width H1 (FIG. 7) of the imaging unit 31 of the first embodiment in the subscanning direction Y. Therefore, the present embodiment has an effect that the dimension of the imaging unit 31K in the subscanning direction Y is smaller as compared to that of the first embodiment.

The imaging unit 31K of the present embodiment has three line sensors 31Ra, 31Ga, and 31Ba, although no limitation thereto is intended. Instead of the three line sensors 31Ra, 31Ga, and 31Ba and the peripheral circuits 31A and 31P corresponding thereto, one line sensor and peripheral circuits corresponding thereto may be adopted.

Fifth Embodiment

Figure 21:
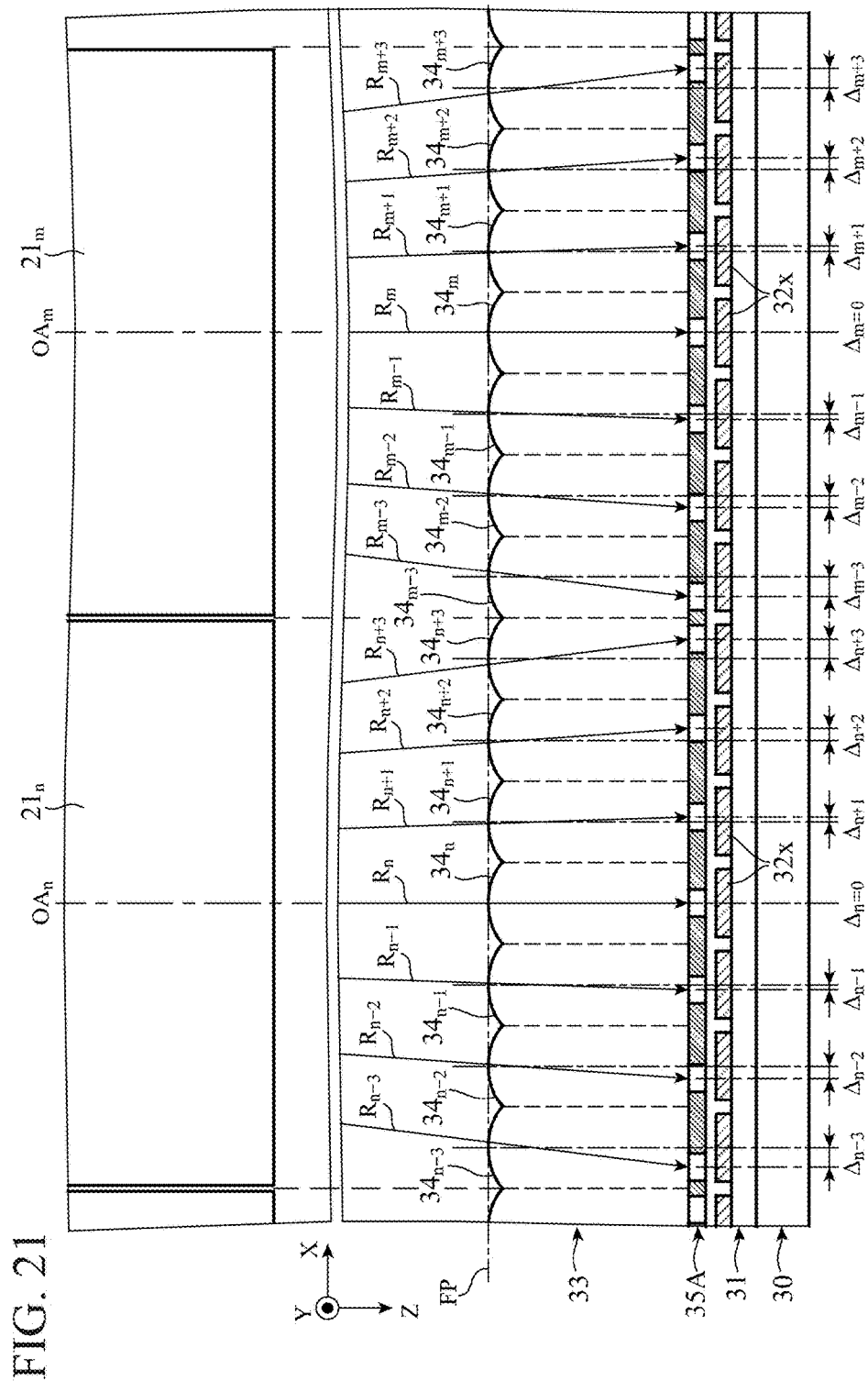
FIG. 21 is a cross-sectional view schematically illustrating an example of a structure of a light shielding pattern of a fifth embodiment according to the present invention.

Next, a fifth embodiment according to the present invention will be described. FIG. 21 is a cross-sectional view schematically illustrating an example of a structure of a light shielding pattern 35A of the fifth embodiment. A configuration of an image capturing device of the present embodiment is the same as that of the image capturing device 1 of the first embodiment except that the light shielding pattern 35A of FIG. 21 is included instead of the light shielding pattern 35 of the first embodiment described above.

In FIG. 21, two adjacent rod lenses $21_n$ and $21_m$ (n and m are consecutive integers), a microlens array 33 including microlenses $34_{n-3}$ to $34_{n+3}$ and $34_{m-3}$ to $34_{m+3}$ that are arranged at the focal position FP of these rod lenses $21_n$ and $21_m$, an imaging unit 31 including light-sensitive pixels 32x that are arranged at the focal position of the microlens array 33, and a light shielding pattern 35A that is arranged between the imaging unit 31 and the microlens array 33. The microlenses $34_{n-3}$ to $34_{n+3}$ and $34_{m-3}$ to $34_{m+3}$ have the same configuration as that of the microlens 34 of the first embodiment described above.

In the first embodiment, as illustrated in FIG. 9, the center of an opening 35s of the light shielding pattern 35 in the main scanning direction X is arranged on the optical axis of a corresponding microlens 34. Therefore, the positional displacement amount in the main scanning direction X between the opening 35s of the light shielding pattern 35 and the optical axis of a microlens 34 corresponding thereto is always zero.

In the present embodiment, as illustrated in FIG. 21, the microlenses $34_{n-3}$ to $34_{n+3}$ are arranged at positions facing the rod lens $21_n$ on the left. The principal rays $R_{n-3}$ to $R_{n+3}$ incident on the microlenses $34_{n-3}$ to $34_{n+3}$ from the rod lens $21_n$ are propagated to the light shielding pattern 35A, respectively. As the distance from the optical axis $OA_n$ of the rod lens $21_n$ increases, the incident angle of these principal rays $R_{n-3}$ to $R_{n+3}$ on an image-forming plane increases. Therefore, arrival positions of the principal rays $R_{n-3}$ to $R_{n+3}$ to the light shielding pattern 35A are deviated from the optical axes of the microlenses $34_{n-3}$ to $34_{n+3}$ as the arrival positions depart from the optical axis $OA_n$ of the rod lens $21_n$. In coordination with this, positional displacement amounts $\Delta_{n-3}$ to $\Delta_{n+3}$ in the main scanning direction X are provided between the centers of openings of the light shielding pattern 35A and optical axes of the microlenses $34_{n-3}$ to $34_{n+3}$, respectively. The displacement amounts $\Delta_{n-3}$ to $\Delta_{n+3}$ increase as the openings are apart from the optical axis $OA_n$ of the rod lens $21_n$ in the main scanning direction X. Here, since the optical axis of the microlens $34_n$ coincides with the optical axis $OA_n$ of the rod lens $21_n$, the positional displacement amount $\Delta_n$ between the optical axis of the microlens $34_n$ and the center of the opening corresponding thereto is zero.

Similarly, the microlenses $34_{m-3}$ to $34_{m+3}$ are arranged at positions facing the right rod lens $21_m$. The principal rays $R_{m-3}$ to $R_{m+3}$ incident on the microlenses $34_{m-3}$ to $34_{m+3}$ from the rod lens $21_m$ are propagated to the light shielding pattern 35A, respectively. positional displacement amounts $\Delta_{m-3}$ to $\Delta_{m+3}$ in the main scanning direction X are provided between the centers of openings of the light shielding pattern 35A and optical axes of the microlenses $34_{m-3}$ to $34_{m+3}$, respectively. The displacement amounts $\Delta_{m-3}$ to $\Delta_{m+3}$ increase as the openings are apart from the optical axis $OA_m$ of the rod lens $21_m$ in the main scanning direction X. Here, the positional displacement amount $\Delta_m$ between the optical axis of the microlens $34_m$ and the center of the opening corresponding thereto is zero.

Because the openings of the light shielding pattern 35A are arranged as described above, the ratio of light rays passing through the openings with respect to incident light rays from rod lenses (hereinafter, also referred to as "direct-covering rod lenses") existing directly above the respective light-sensitive pixels 32x (negative direction in the Z axis) is large. As a result, in an image acquired by the imaging unit 31, the contribution of the light rays from the direct-covering rod lenses is large. Moreover, superimposition of images between the adjacent rod lenses $21_n$ and $21_m$ is suppressed, which increases the depth of field as a result.

It is further desirable to limit the width of the openings of the light shielding pattern 35A and to allow the visual field length of each of the rod lenses $21_n$ and $21_m$ to be equal to the array pitch of the rod lenses $21_n$ and $21_m$. This prevents the fields of view of the rod lenses $21_n$ and $21_m$ from overlapping between the rod lenses $21_n$ and $21_m$ and prevents superimposition of images between the rod lenses $21_n$ and $21_m$. In this case, in the case where the central positions of the openings of the light shielding pattern 35A are set so as to coincide with incident positions of the principal rays as in the present embodiment, shading of light rays by the light shielding pattern 35A is suppressed, thereby enabling to obtain captured images more completely separated between the adjacent rod lenses $21_n$ and $21_m$. As a result, it is possible to obtain a captured image in which deterioration of the depth of field caused by superimposed areas of images between the rod lenses $21_n$ and $21_m$ is suppressed.

Sixth Embodiment

Figure 22:
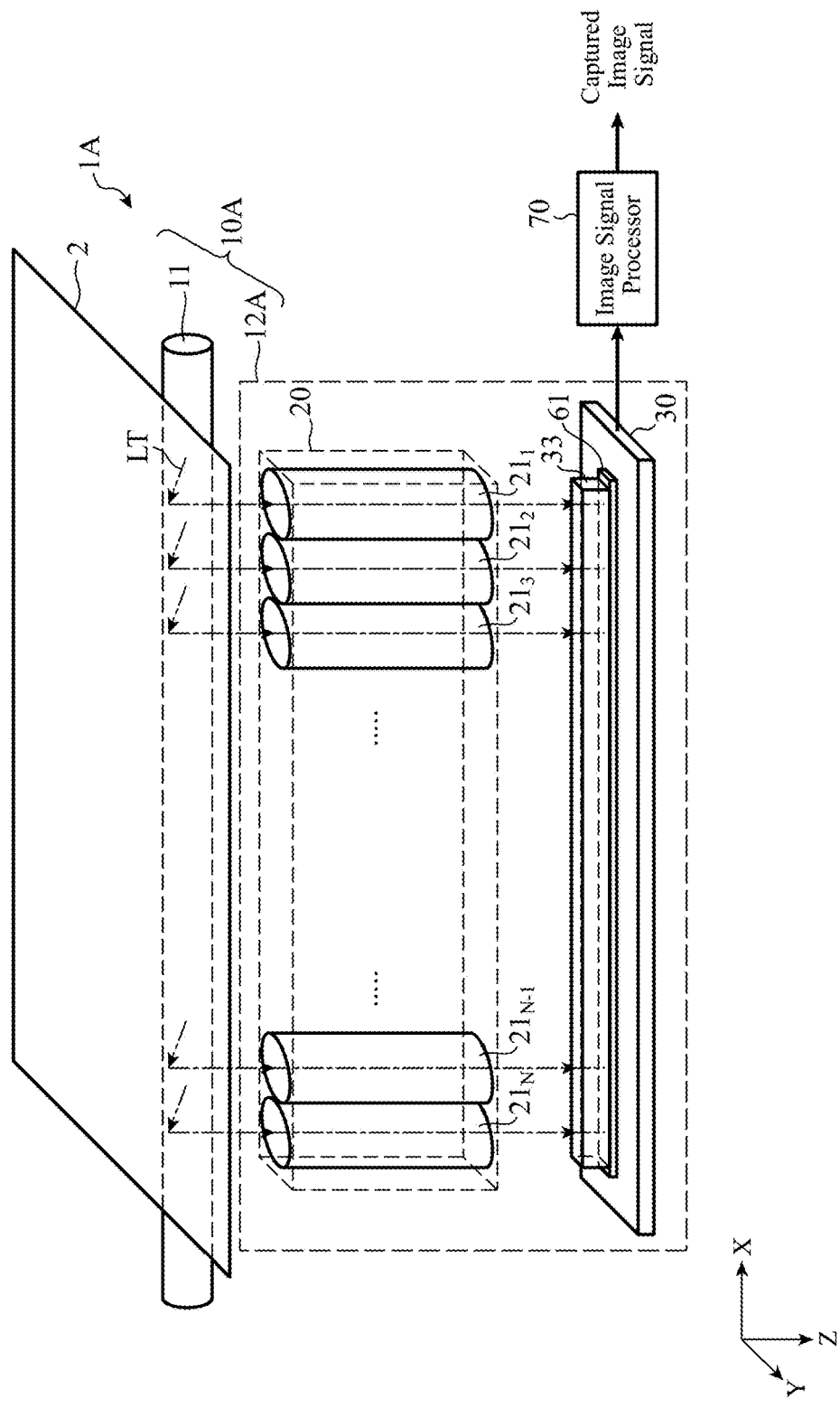
FIG. 22 is a perspective view illustrating a schematic configuration of an image capturing device of a sixth embodiment according to the present invention.

Next, a sixth embodiment according to the present invention will be described. FIG. 22 is a perspective view schematically illustrating the main part of a configuration of an image capturing device 1A of a sixth embodiment according to the present invention.

The image capturing device 1A includes a contact image sensor unit 10A (hereinafter referred to as "CIS unit 10A") that is an image capturing unit, and an image signal processor 70 that generates a captured image signal by performing image processing on an output signal of the CIS unit 10A, that is, a raw image signal. A configuration of the CIS unit 10A of the present embodiment is the same as that of the CIS unit 10 of the first embodiment except that an imaging unit 61 of FIG. 22 is included instead of the imaging unit 31 and the light shielding pattern 35 of the first embodiment. A rod lens array 20, a sensor substrate 30, the imaging unit 61, and a microlens array 33 are mounted in a single housing 12A.

Like in the case of the first embodiment, the image capturing device 1A includes a scanning drive mechanism (not illustrated) that moves the CIS unit 10A along the subscanning direction Y relative to a target object 2 distributed two-dimensionally along the main scanning direction X and the subscanning direction Y. With the CIS unit 10A relatively moving along the subscanning direction Y with respect to the target object 2, the entire surface to be scanned of the target object 2 can be scanned. Note that the scanning drive mechanism may be any one of a mechanism that moves the CIS unit 10A in the subscanning direction Y relative to the target object 2 or a mechanism that moves the target object 2 in the subscanning direction Y relative to the CIS unit 10A.

The rod lens array 20 includes N rod lenses $21_1$, $21_2$, . . . , and $21_N$ arrayed along the main scanning direction X as N imaging optical elements. These rod lenses $21_1$, $21_2$, . . . , and $21_N$ form N erect equal-magnification images at the focal positions (incident surface of the microlens array 33) of the rod lenses $21_1$ to $21_N$ on the basis of light scattered by the target object 2. The microlens array 33 condenses light rays incident from the rod lenses $21_1$ to $21_N$ onto light-sensitive pixel groups on the imaging unit 61.

Figure 23:
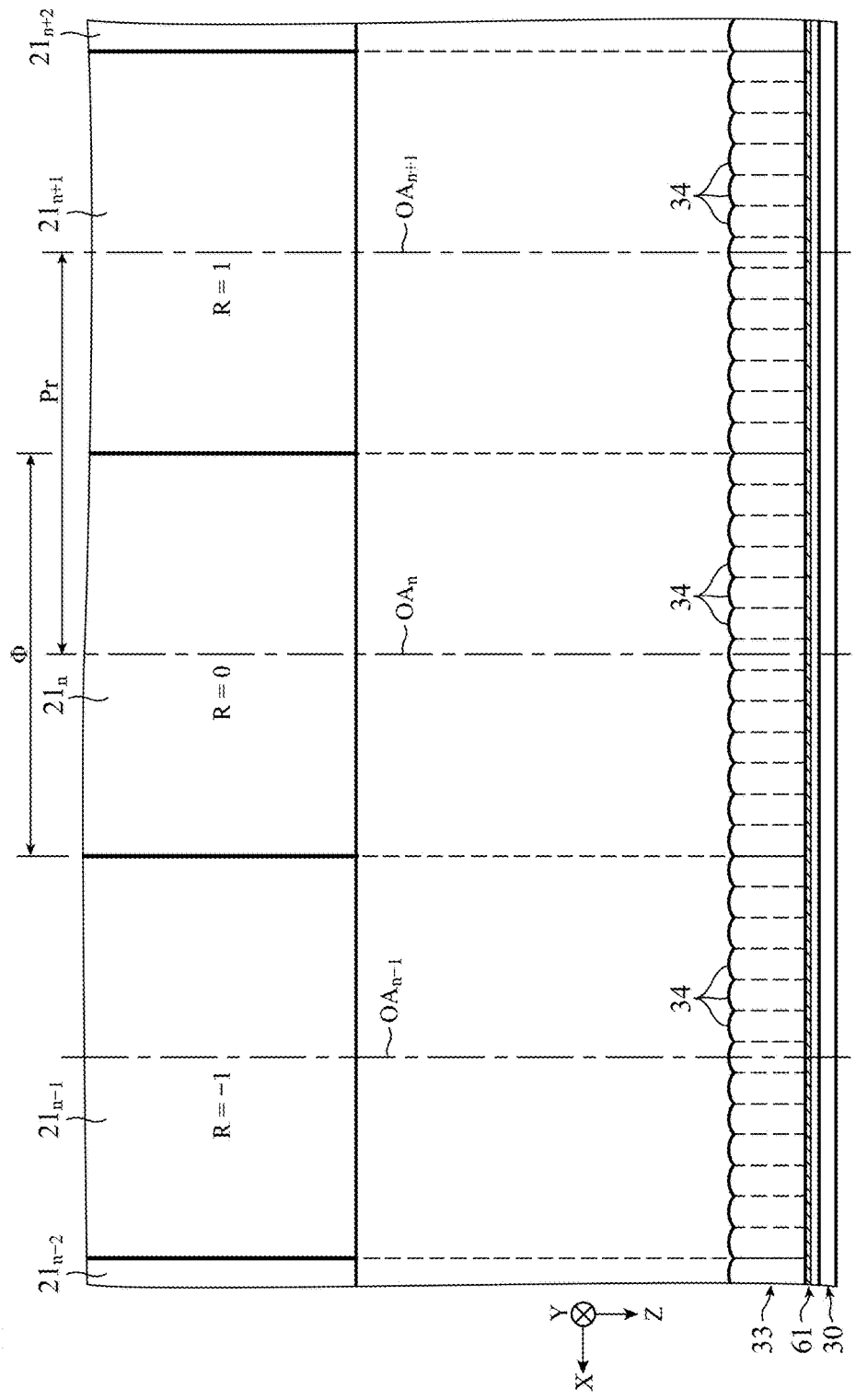
FIG. 23 is a diagram schematically illustrating a positional relationship among a rod lens array, a microlens array, an imaging unit, and a sensor substrate of a sixth embodiment.

FIG. 23 is a diagram schematically illustrating a positional relationship among the rod lens array 20, the microlens array 33, the imaging unit 61, and the sensor substrate 30. In the example of FIG. 23, rod lenses $21_{n-2}$, $21_{n-1}$, $21_n$, $21_{n+1}$ and $21_{n+2}$ (n is an integer) included in the rod lens array 20 are arranged along the main scanning direction X. In FIG. 23, for convenience of description, numbers R=−1, 0, and 1 allocated to the rod lenses $21_{n+R}$ are illustrated using the rod lens $21_n$ as a reference. A lens group including thirteen microlenses 34 is arranged for each of the rod lenses $21_{n+R}$ while centered at the optical axis $OA_{n+R}$ of the rod lens $21_{n+R}$. Therefore, in the entire rod lens array 20, microlenses 34 forming N lens groups, each of which is arranged at the focal position of each of the N rod lenses $21_1$ to $21_N$. However, the number of the microlenses 34 forming each lens group is not limited to thirteen.

Figure 24:
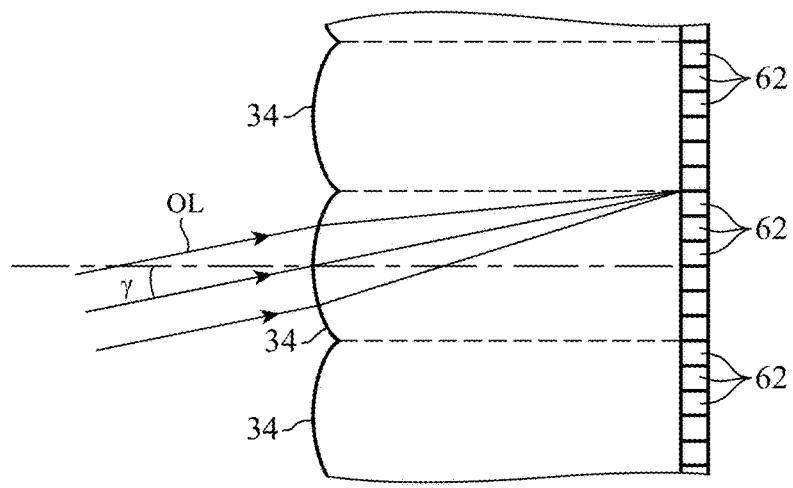
FIG. 24 is a diagram illustrating microlenses and light-sensitive pixels of the sixth embodiment.

As illustrated in FIG. 24, the imaging unit 61 has light-sensitive pixels 62 that are arrayed along the main scanning direction X at positions where light rays are condensed by the microlenses 34. Like the light-sensitive pixels 32r, 32g, 32b, . . . of the first embodiment, these light-sensitive pixels 62 can be configured using solid imaging elements such as CMOS image sensors or CCD image sensors. Each of the light-sensitive pixels 62 outputs an analog received signal having an intensity corresponding to the amount of incident light to a peripheral circuit on the imaging unit 61. Like the peripheral circuits 31A and 31P of the first embodiment, this peripheral circuit performs signal processing on the analog received signal input from each of the light-sensitive pixels 62 to generate a digital received signal and outputs the digital received signal to the image signal processor 70 via the sensor substrate 30 and a signal transmission path (for example, a cable) of FIG. 22. As will be described in detail later, the image signal processor 70 can generate one captured image by constructing N field-of-view images (digital images) representing N erect equal-magnification images formed by the rod lenses $21_1$ to $21_N$ on the basis of raw image signals including a group of digital received signals output from the imaging unit 61 and combining these N field-of-view images.

In the example of FIG. 24, a light-sensitive pixel group including a set of six light-sensitive pixels 62 is arranged for one microlens 34. Therefore, each of thirteen microlenses 34 provided to each of the rod lenses $21_{n+R}$ condenses light rays to thirteen sets of light-sensitive pixel groups including a total of 78 (=6×13 sets) light-sensitive pixels 62. Light-sensitive pixel groups provided to each of the rod lenses $21_{n+R}$ can detect a condensed image formed by thirteen microlenses 34. Note that the number of light-sensitive pixels arranged for one microlens 34 is not particularly limited.

For example, the following configuration example is conceivable:
Diameter Φ of each of the rod lenses $21_{n+R}$: 546 μm;
Array pitch Pr of the rod lenses $21_1$ to $21_N$: 546 μm;
half angle of field of view of each of the rod lenses $21_{n+R}$ ω: 9°;
Array pitch in the main scanning direction X of the microlenses 34: 42 μm;
Curvature R of cylindrical lens surfaces of the microlenses 34: 78 μm;
Refractive index n of the microlenses 34: 1.59; and
Thickness of the microlenses 34: 211 μm.

In this configuration example, the array pitch (=42 μm) of the microlenses 34 is 1/13 of the pitch Pr of the rod lenses $21_1$ to $21_N$. FIG. 24 illustrates a state in which parallel rays OL incident on a microlens 34 at the same incident angle γ as the half angle of field of view ω=9° of each of the rod lenses $21_{n+R}$ are condensed. An array pitch of the light-sensitive pixels 62 in the main scanning direction X is 7 μm. The focal length $f_M$ of the microlenses 34 is $f_M$=R/(n−1)=133 μm. The focal length in a medium having the refractive index n is obtained by n×$f_M$=211 μm, and the parallel rays OL can be focused on the bottom surface of the microlens 34 after entering the microlens 34.

The parallel rays OL illustrated in FIG. 24 are rays of light incident on the microlens 34 from a point at an end of the field of view field on an object via a rod lens $21_{n+R}$. The light rays OL are condensed by the microlens 34 and are focused on the bottom surface of the microlens 34. The position at which the light rays OL are focused in this case is a position apart from the optical axis of the microlens 34 in the main scanning direction X by the following value δ, which is the boundary position between microlenses 34:

$$\delta = f_M \times \tan \gamma = 21 \ \mu m.$$

Since there are no light rays incident on the microlens 34 at an incident angle exceeding the half angle of field of view ω, the light rays incident on the microlens 34 are avoided from interfering with light rays incident on light-sensitive pixels 62 on the bottom surface of other microlenses 34 adjacent to the microlens 34. In the present embodiment, light rays incident on a certain microlens 34 and light rays incident on other microlenses 34 do not interfere with each other in the imaging unit 61.

As illustrated in FIG. 9 and the above equation (2), an image-forming position Xa in the main scanning direction X varies depending on the incident angle α of light rays on the microlens 34. Since the incident angle α (unit: radian) is a small angle, the above equation (2) can be transformed to the following approximation (2a):

$$Xa = f_M \times \alpha. \quad (2a)$$

That is, the image-forming position Xa has a linear relationship with the incident angle α. Since six light-sensitive pixels 62 are provided corresponding to one microlens 34, these six light-sensitive pixels 62 can receive light rays incident at an incident angle α within the ranges of −9≤α≤−6°, −6≤α≤−3°, −3≤α≤0°, 0≤α≤3°, 3≤α≤6°, and 6≤α≤9°, respectively.

Figure 25:
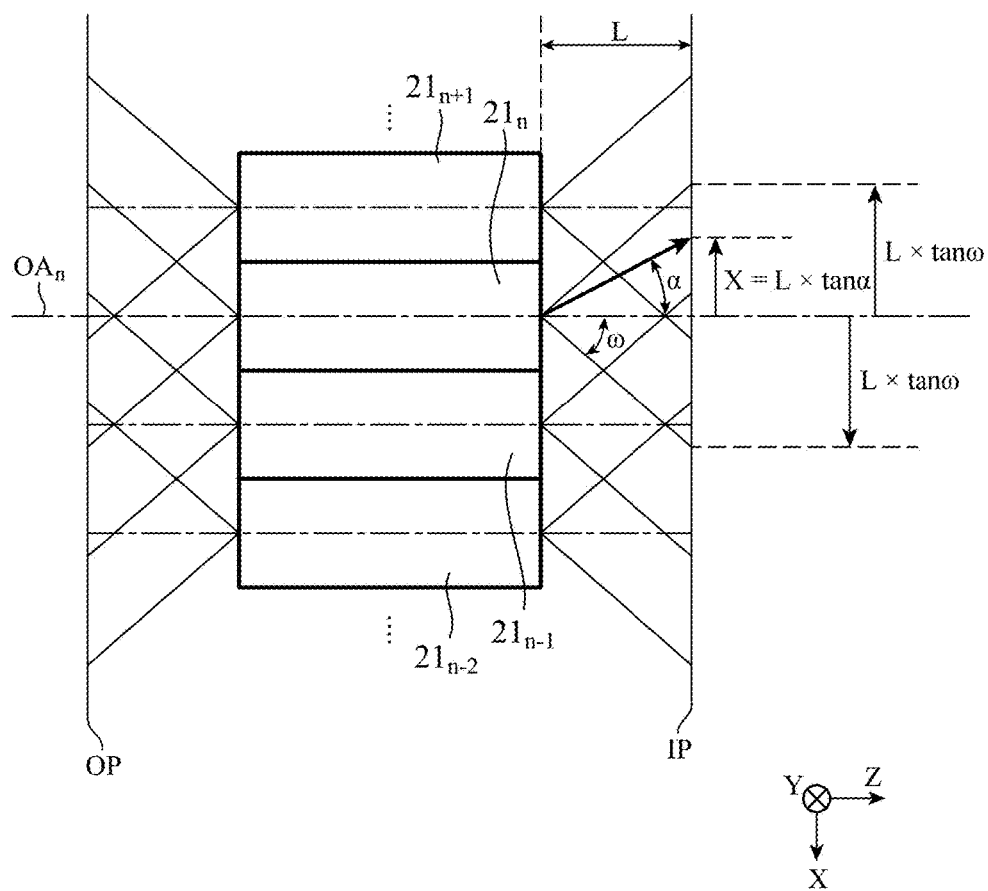
FIG. 25 is a diagram illustrating condensing positions on a focal plane of rod lenses of the sixth embodiment.

Meanwhile, as illustrated in FIG. 25, a position apart from the optical axis $OA_n$ of the rod lens $21_n$ in the main scanning direction X on the focal plane IP of the rod lens $21_n$ (R=0) is denoted by X. On the optical axis $OA_R$, X=0 holds. The position X is expressed by the following expression:

$$X = L \times \tan \alpha.$$

Here, as illustrated in FIG. 25, L denotes an interval between an emitting end of the rod lens $21_n$ and the focal plane IP. In the case of the above configuration example, L=5.68 mm.

Figure 26:
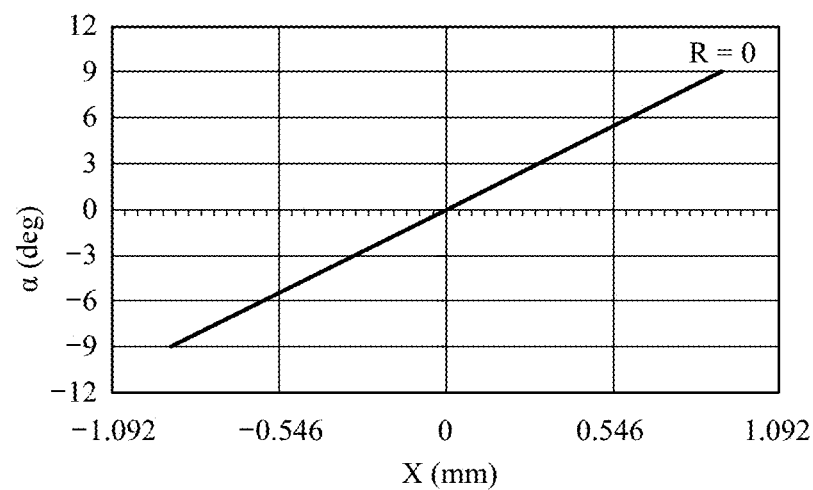
FIG. 26 is a graph illustrating a relationship between the incident angle of light rays on a microlens and the condensing position.

FIG. 26 is a graph illustrating the relationship between the incident angle α of light rays on the microlens 34 and the condensing position X with respect to the principal ray that has passed through the rod lens $21_n$ (R=0). In this graph, the horizontal axis represents the position X (unit: mm) while the vertical axis represents the incident angle α (unit: °). As indicated by a solid line in FIG. 26, the position X and the incident angle α have a substantially linear relationship, and the incident angle α ranges −9° to +9°, and thus the position X ranges −0.9 mm–+0.9 mm, that is, within the range of about 3.3 times the pitch Pr (=546 μm) of the rod lenses $21_1$ to $21_N$ (within a range equivalent to about 3.3 rod lenses).

Figure 27:
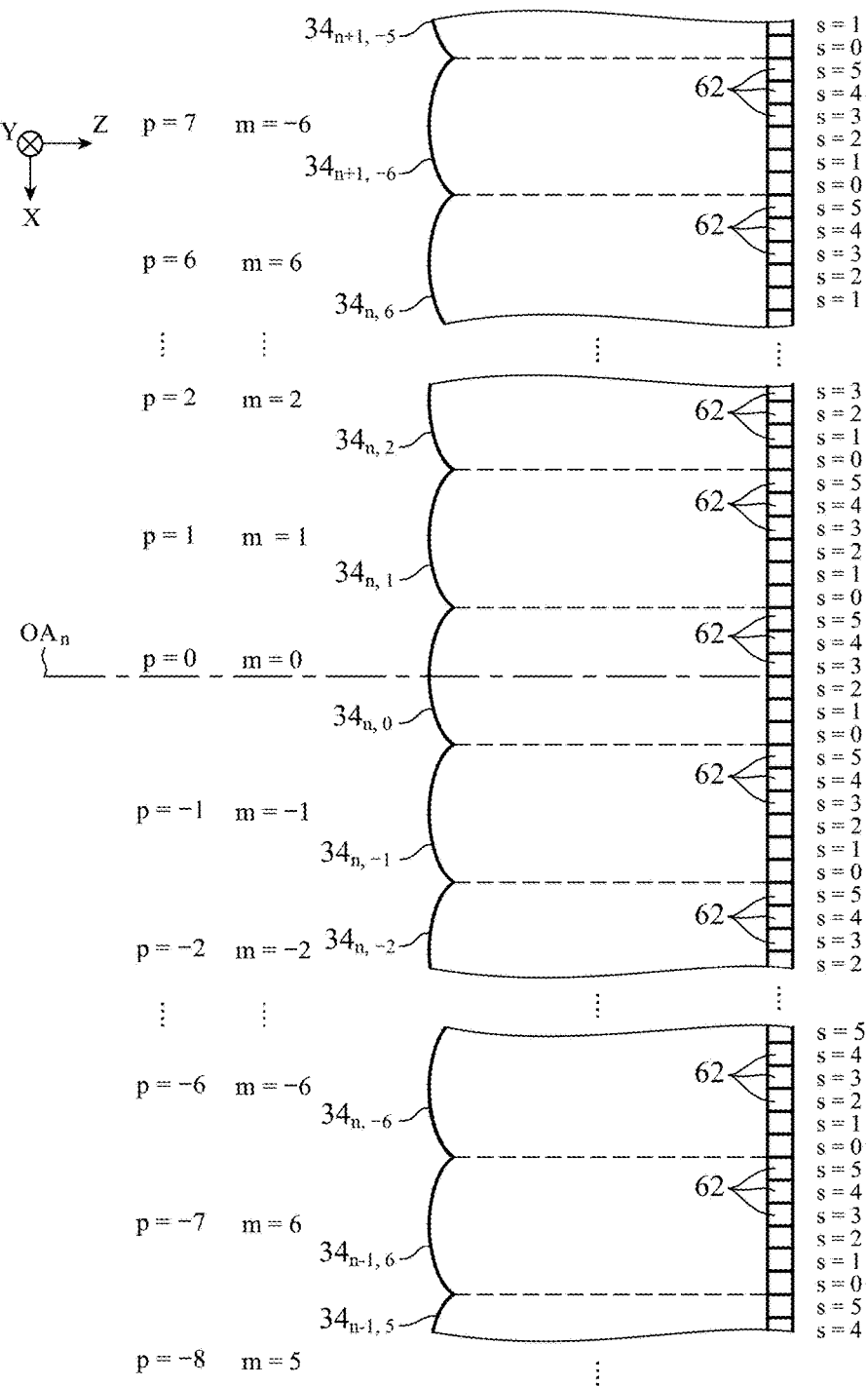
FIG. 27 is a diagram illustrating arrangement of microlenses and light-sensitive pixels of the sixth embodiment.

FIG. 27 is a schematic diagram illustrating an example of microlens groups and light-sensitive pixel groups arrayed along the main scanning direction X while centered at the optical axis $OA_n$ of the n-th rod lens $21_n$. In FIG. 27, a symbol $34_{n,m}$ is assigned to a microlens 34 provided corresponding to the n-th rod lens $21_n$. A symbol $34_{n,0}$ is assigned to a microlens 34 arranged on the optical axis $OA_n$. Where m>0, a microlens $34_{n,m}$ denotes microlenses 34 that are apart from the central microlens $34_{n,0}$ in the negative direction in the main scanning direction X. Where m<0, a microlens $34_{n,m}$ denotes microlenses 34 that are apart from the central microlens $34_{n,0}$ in the positive direction in the main scanning direction X. A symbol $34_{n+1,m}$ is assigned to a microlens 34 provided corresponding to an (n+1)th rod lens $21_{n+1}$, and a symbol $34_{n-1,m}$ is assigned to a microlens 34 provided corresponding to an (n−1)th rod lens $21_{n-1}$. Furthermore, s=0, 1, 2, 3, 4, and 5 are allocated to six light-sensitive pixels 62, 62, 62, 62, 62, and 62, respectively, provided corresponding to each of the microlenses 34. An integer p is a number allocated to a microlens 34 using the microlens $34_{n,0}$ on the optical axis $OA_n$ of the rod lens $21_n$ as a reference (p=0). Unlike number m, this number p is assigned to the microlenses 34 beyond the boundary between the rod lenses $21_n$ and $21_{n+1}$ and the boundary between the rod lenses $21_n$ and $21_{n-1}$.

In the case of the above configuration example, light-sensitive pixels to which light rays passed through the rod lens $21_n$ (R=0) reach are any of six light-sensitive pixels directly under microlenses 34 in the range of X=−0.9 mm to +0.9 mm (FIG. 26). FIGS. 28A to 28D are diagrams schematically illustrate light rays incident on microlenses $34_{n,0}$, $34_{n,3}$, and $34_{n,6}$.

Moreover, in the case of the above configuration example, light rays passed through the rod lens $21_n$ (R=0) and entered the microlens $34_{n,0}$ spread over a range of −2.75° to +2.75° around an incident angle of θ=0°. Here, as schematically illustrated in FIG. 28A, the light rays reach light-sensitive pixels 62, 62 of s=2, 3 but do not reach light-sensitive pixels of s=0, 1, 4, 5. Meanwhile, light rays passed through the rod lens $21_n$ (R=0) and entered the microlens $34_{n,3}$ spread over a range of −2.75° to +2.75° around an incident angle of 1.27°. Here, as schematically illustrated in FIG. 28B, the light rays reach light-sensitive pixels 62, 62, 62 of s=2, 3, 4. Furthermore, light rays passed through the rod lens $21_n$ (R=0) and entered the microlens $34_{n,6}$ spread over a range of −2.75° to +2.75° around an incident angle of 2.54°. Here, as schematically illustrated in FIG. 28C, most of the light rays reach the light-sensitive pixels 62, 62 of s=3, 4 while a small part of the light rays reaches the light-sensitive pixel 62 of s=2.

In this manner, the incident angle of light rays on a microlens 34 can be continuous values, whereas the light-sensitive surface on the bottom surface of the microlens 34 is divided into 6 segments by six light-sensitive pixels 62. Therefore, on the light-sensitive surface, there are light-sensitive pixels 62 on which light rays passed through only one rod lens $21_n$ are incident as well as light-sensitive pixels 62 on which light rays passed through adjacent multiple rod lenses $21_{n-1}$ and $21_{n+1}$ are incident in a mixed manner. For example, FIG. 28D is a diagram in which light rays from the adjacent rod lenses $21_{n-1}$ and $21_{n+1}$ (R=−1, R=+1) are added to those of the rod lens $21_n$ of R=0 of FIG. 28A. In this case, most of light rays reaching the light-sensitive pixel of s=3 are light rays arriving from the rod lens $21_n$ of R=0, and light rays passed through the rod lens $21_{n-1}$ of R=−1 are also slightly mixed. Only light rays passed through the rod lens $21_{n-1}$ of R=−1 reach the light-sensitive pixel of s=4. Most of light rays reaching the light-sensitive pixel of s=5 are light rays passed through the rod lens $21_{n-1}$ of R=−1, and light rays reaching from the rod lens $21_{n-2}$ (not illustrated) of R=−2 are also slightly mixed.

Selecting only light-sensitive pixels 62, in which light rays passed through a single rod lens occupy the majority, out of the plurality of light-sensitive pixels on the bottom surface of the microlenses 34 enables to construct a digital image representing an image formed by a single rod lens.

Figure 29:
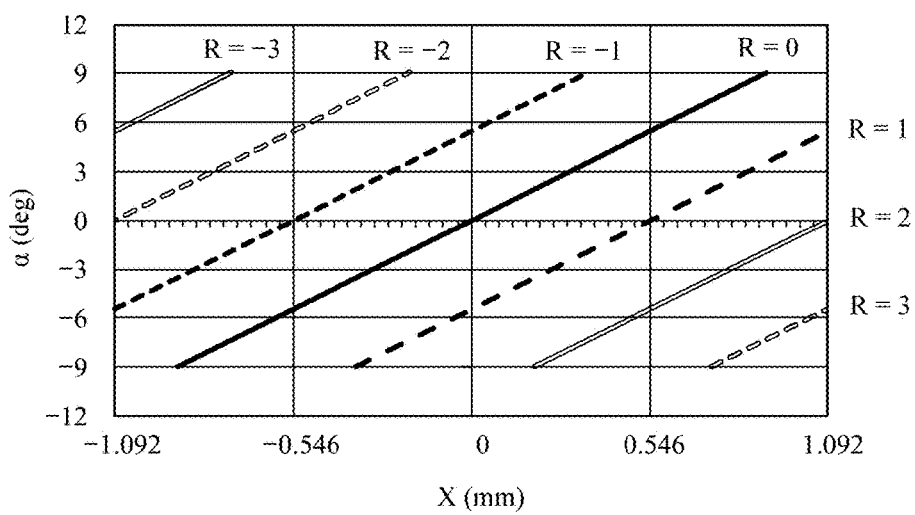
FIG. 29 is a graph illustrating an exemplary relationship between the incident angle of light rays on a microlens and the condensing position.

There is a possibility that, to a light-sensitive pixel group in the range of X=−1.092 mm to +1.092 mm which corresponds to the width of four rod lenses, light rays passed through any one of seven rod lenses $21_{n-3}$, $21_{n-2}$, $21_{n-1}$, $21_n$, $21_{n+1}$, $21_{n+2}$, $21_{n+3}$ (R=−3 to +3) may reach. FIG. 29 is a graph illustrating an example of the relationship between the incident angle α and the condensing position of light rays incident on microlenses 34 with respect to light rays passed through the seven rod lenses $21_{n-3}$ to $21_{n+3}$ (R=−3 to +3). According to FIG. 29, it is clear that for example for X=0 light flux having the principal ray of α=0° is incident from the rod lens $21_n$ (R=0), light flux having the principal ray of α=5.5° is incident from the rod lens $21_{n-1}$ (R=−1), and light flux having the principal ray of α=−5.5° is incident from the rod lens $21_{n+1}$ (R=+1).

On light-sensitive surfaces of a light-sensitive pixel group of the present embodiment, effective light-sensitive regions for receiving only light rays incident on a microlens $34_{n,m}$ at an incident angle α within a limited angle range, among the principal rays passed through a rod lens $21_n$ is set for each of the rod lenses $21_n$. An effective light-sensitive region is set for each of the microlenses $34_{n,m}$. Assuming that $\alpha_1$ and $\alpha_2$ are incident angles of light rays on a microlens $34_{n,m}$ and critical angles defining the lower limit and the upper limit of the limited angle range, respectively, the limited angle range can be expressed as the following inequality using the critical angles $\alpha_1$ and $\alpha_2$, where $\alpha_1$ and $\alpha_2$ may be a positive or a negative value:

$$\alpha_1 < \alpha < \alpha_2.$$

Figure 30:
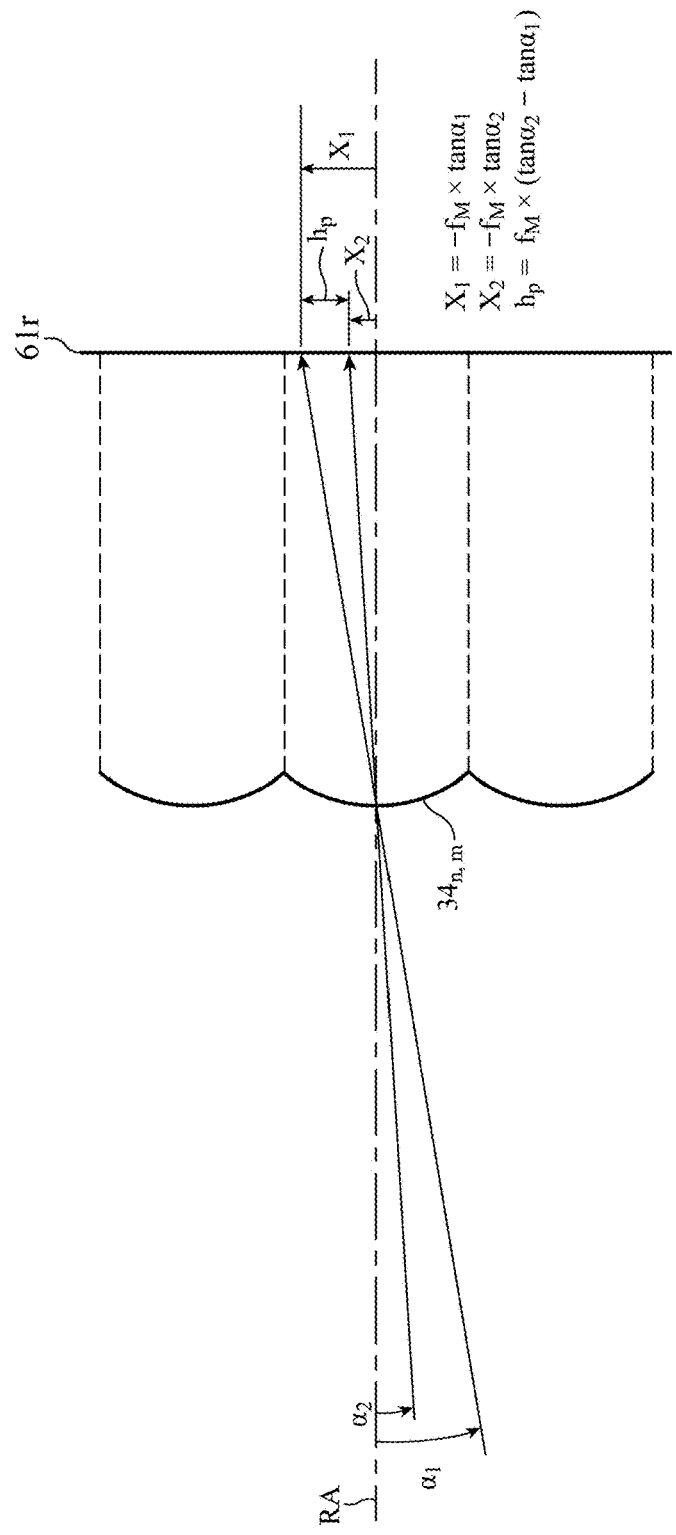
FIG. 30 schematically illustrates a explanatory diagram of an effective light-sensitive region of the sixth embodiment.

FIG. 30 schematically illustrates a explanatory diagram of an effective light-sensitive region set for a microlens $34_{n,m}$. The example of FIG. 30, schematically illustrates a state in which light rays refracted and transmitted through the microlens $34_{n,m}$ are incident on a light-sensitive surface $61r$ of a light-sensitive pixel group. Both critical angles $\alpha_1$ and $\alpha_2$ illustrated in FIG. 30 are negative values. As illustrated in FIG. 30, when positions at which light rays incident on a microlens $34_{n,m}$ at the critical angles $\alpha_1$ and $\alpha_2$ reach a light-sensitive surface $61r$ in the main scanning direction X are denoted by $X_1$ and $X_2$, the arrival positions $X_1$ and $X_2$ are derived by $-f_M \times \tan \alpha_1$ and $-f_M \times \tan \alpha_2$, respectively, in the main scanning direction X. Here, $f_M$ denotes the focal length of the microlenses $34_{n,m}$. When the light reception width in the main scanning direction X of an effective light-sensitive region is denoted by hp, the critical angles $\alpha_1$ and $\alpha_2$ satisfy the following relational expression (8):

$$hp = f_M \times |\tan \alpha_2 - \tan \alpha_1|. \tag{8}$$

When light rays having the same incident angle $\gamma$ as a half angle of field of view of the rod lens $21_n$ are incident on a microlens $34_{n,m}$, the position of the light rays reaching the light-sensitive surface $61r$ in the main scanning direction X is $f_M \times \tan \gamma$. Here, the following inequality (9) holds:

$$hp < 2 \times f_M \times \tan \gamma. \tag{9}$$

From the above expressions (8) and (9), the following inequality (10) is derived:

$$|\tan \alpha_2 - \tan \alpha_1| < 2 \times \tan \gamma. \tag{10}$$

As will be described later, a light-sensitive pixel group is classified into main light-sensitive pixels which are multiple light-sensitive pixels 62 forming an effective light-sensitive region and sub light-sensitive pixels which are light-sensitive pixels 62 other than the main light-sensitive pixels for each principal ray passing through each of the rod lenses $21_n$.

The image signal processor 70 has a function of generating a captured image by constructing N field-of-view images representing N erect equal-magnification images formed by the rod lenses $21_1$ to $21_N$ and combining the N field-of-view images. For each of principal rays passed through each of the rod lenses $21_n$, the image signal processor 70 selects received signals output from main light-sensitive pixels from received signals output from a light-sensitive pixel group but does not select received signals output from sub light-sensitive pixels. Based on the selected received signals, the image signal processor 70 constructs an n-th field-of-view image corresponding to the rod lens $21_n$.

By distinguishing main light-sensitive pixels and sub light-sensitive pixels for each of the rod lenses $21_n$, the present embodiment can implement substantially similar functions as those of the fifth embodiment. That is, by selecting main light-sensitive pixels so as to coincide with an incident position of principal rays on the light-sensitive pixel groups of the imaging unit 61, it is possible to obtain a captured image in which deterioration of the depth of field caused by superimposed regions of images between the rod lenses $21_n$ and $21_{n+1}$ and between the rod lenses $21_n$ and $21_{n-1}$ is suppressed.

Figure 31:
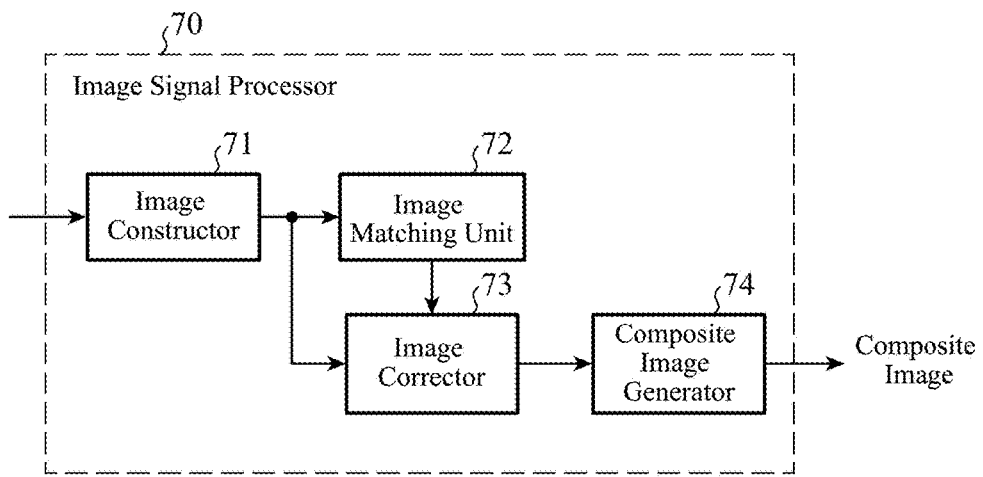
FIG. 31 is a block diagram illustrating a schematic configuration of an image signal processor of the sixth embodiment.
Figure 32:
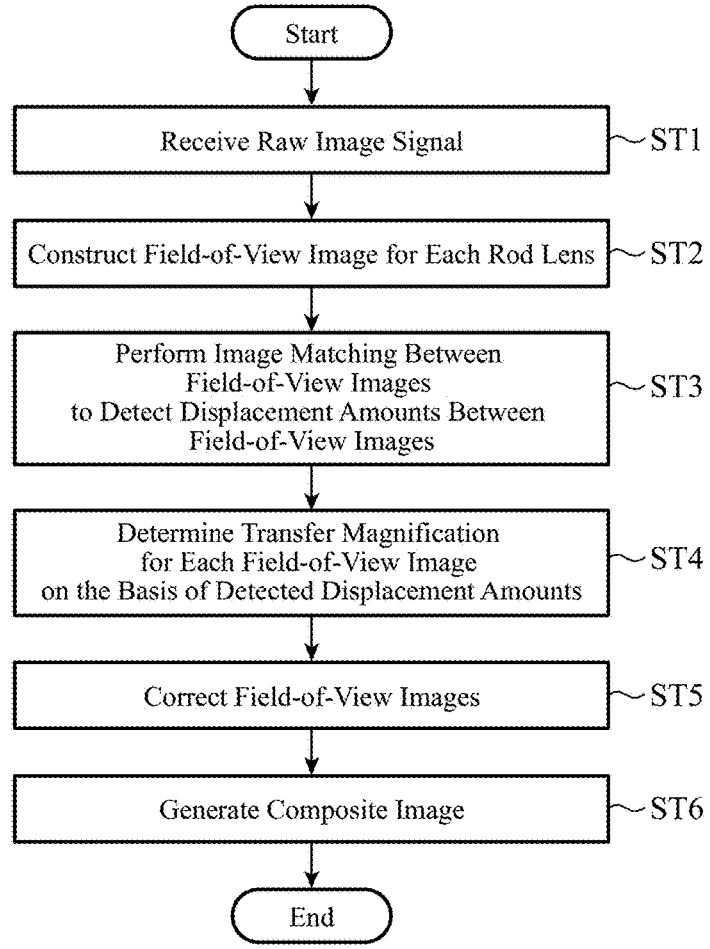
FIG. 32 is a flowchart illustrating an exemplary procedure of image processing of the sixth embodiment.

Next, a configuration of the image signal processor 70 will be described with reference to FIGS. 31 and 32. FIG. 31 is a block diagram schematically illustrating a configuration example of the image signal processor 70 of the sixth embodiment. FIG. 32 is a flowchart illustrating an exemplary procedure of image processing of the sixth embodiment.

As illustrated in FIG. 31, the image signal processor 70 includes: an image constructor 71 that constructs N field-of-view images $M_1$ to $M_N$ on the basis of raw image signals input from the imaging unit 61; an image matching unit 72 that detects a displacement amount $D(i, j)$ between field-of-view images $M_i$ and $M_j$ by executing image matching between adjacent field-of-view images $M_i$ and $M_j$ (j=i+1); an image corrector 73 that corrects the field-of-view images $M_1$ to $M_N$ by estimating transfer magnifications $\tau_i$ to $\tau_{N-1}$ of N−1 boundary regions in the field-of-view images $M_1$ to $M_N$ on the basis of the displacement amount $D(i, j)$, and enlarges or reduces each of the field-of-view images $M_1$ to $M_N$ using the transfer magnifications $\tau_i$ to $\tau_{N-1}$; and a composite image generator 74 that combines the corrected field-of-view images $CM_1$ to $CM_N$ to generate a composite image and outputs the composite image as a captured image.

Here, the transfer magnification $\tau_i$ means the transfer magnification in a boundary region between field-of-view images $M_i$ and $M_{i+1}$. For example, the image corrector 73 can correct the field-of-view images $M_1$ to $M_{N-1}$ by using the transfer magnifications $\tau_i$ to $\tau_{N-1}$, respectively, and the transfer magnification $T_{N-1}$ can be used for correcting the field-of-view image $M_N$. Alternatively, the image corrector 73 may calculate the transfer magnification by interpolation using a set of transfer magnifications $\tau_n$ and $\tau_{n+1}$ or by using the transfer magnifications $\tau_1$ to $\tau_{N-1}$. It is also possible to calculate a transfer magnification distribution that varies continuously such that transfer magnifications at both ends of a field-of-view image $M_n$ match each other by interpolation of the transfer magnification and to use this transfer magnification distribution for correction of the field-of-view image. As a result, even in the case where the transfer magnification $\tau_{n-1}$ between the field-of-view images $M_{n-1}$ and $M_n$ and the transfer magnification $\tau_n$ between the field-of-view images $M_n$ and $M_{n+1}$ are different, a high-precision transfer magnification can be used for correction of the field-of-view images.

Referring to FIG. 32, the image constructor 71 first receives a bundle of digital received signals corresponding to detection outputs of all the light-sensitive pixels 62 on the imaging unit 61 as raw image signals and stores the raw image signals in an internal memory (step ST1). This raw image signal is obtained by one time of scanning a surface to be scanned of a target object 2.

Next, the image constructor 71 constructs N field-of-view images $M_1$ to $M_N$ representing N erect equal-magnification images formed by the rod lenses $21_1$ to $21_N$, respectively (step ST2). Specifically, when constructing the n-th field-of-view image $M_n$ corresponding to the n-th rod lens $21_n$, the image constructor 71 focuses on light-sensitive pixel groups immediately below 3×13 microlenses . . . , $34_{n-1,6}$, $34_{n,-6}$, . . . , $34_{n,0}$, . . . , $34_{n,6}$, $34_{n+1,-6}$ (FIG. 27) corresponding to the rod lens $21_n$ and the rod lenses $21_{n-1}$ and $21_{n+1}$ adjacent thereto and selects digital received signals corresponding to detection output of main light-sensitive pixels including effective light-sensitive regions for principal rays passed through the rod lens $21_n$ out of digital received signals corresponding to detection output of these light-sensitive pixel groups. Here, digital received signals corresponding to detection output of sub light-sensitive pixels not including effective light-sensitive regions for the principal rays are not selected. Then, the image constructor 71 constructs the field-of-view image $M_n$ on the basis of the selected digital received signals.

More specifically, the image constructor 71 can construct the n-th field-of-view image $M_n$ using a matrix K defined by the following mathematical formula (11):

$$K=(k_{s,p}),  \quad (11)$$

where $k_{s,p}$ is a matrix element in an s-th row and a p-th column of the matrix K, which is a value of either "0" or "1". The symbol s denotes a row number, and p denotes a column number.

The following mathematical formula is a first example of the matrix K:

$$K = \begin{bmatrix} 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\ 0 & 0 & 0 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 1 & 1 & 1 & 1 & 1 & 1 & 1 & 1 & 1 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 0 & 0 & 0 & 0 & 0 \\ 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 1 & 1 & 1 & 1 \end{bmatrix}$$

$p = -16 \ldots -1 \ 0 \ 1 \ldots 15 \ 16$ $m = -3 \ldots 6-6 \ldots -1 \ 0 \ 1 \ldots 6-6 \ldots 3$ The row number s represents a number from 0 to 5 assigned to each of the light-sensitive pixels 62 illustrated in FIG. 27. The column number p is a number from −16 to +16 assigned to microlenses $34_{n-1,-3}$ to $34_{n-1,6}$, $34_{n,-6}$ to $34_{n,+6}$, and $34_{n+1,-6}$ to $34_{n+1,3}$ immediately below the rod lenses $21_{n-1}$, $21_n$, and $21_{n+1}$. That is, p=−6 to +6 are allocated to the microlenses $34_{n,-6}$ to $34_{n,+6}$ existing immediately below the rod lens $21_n$. The column number p=−16 to −7 are allocated to the microlenses $34_{n-1,3}$ to $34_{n-1,6}$ existing immediately below the rod lens $21_{n-1}$ adjacent to the rod lens $21_n$, and p=+7 to +16 are allocated to the microlenses $34_{n+1,-6}$ to $34_{n+1,3}$ immediately below the rod lens $21_{n+1}$ adjacent to the rod lens $21_n$. A matrix element $k_{s,p}$ corresponds to an s-th light-sensitive pixel 62 immediately below a p-th microlens 34 and means a coefficient to be used for weighting a pixel output value (luminance value) represented by a digital received signal corresponding to detection output of the light-sensitive pixel 62.

Note that, in the first example of the matrix K, a matrix element having a coefficient of "1" corresponds to a main light-sensitive pixel, and a matrix element of a coefficient of "0" corresponds to a sub light-sensitive pixel. For example, in each of the case of p=−2 to 2 and s=2 and 3, the case of p=3 to 7 and s=3 and 4, and the case of p=12, 13 and s=4, 5, the width hp of a main light-sensitive pixel can be set to 14 μm which is equivalent to two pixels. Furthermore, in each of the case of p=8 to 11 and s=4 and the case of p=14 to 16 and s=5, the width hp of a main light-sensitive pixel can be set to 7 μm which is equivalent to one pixel. The limited angle range can be derived from the above expression (8).

Let the luminance distribution of the n-th field-of-view image $M_n$ be $J_{n,p}$. $J_{n,p}$ includes 33 values of pixel number p (−16≤p≤16) for one n and is given by the following mathematical formula (12):

$$J_{np} = \sum_{s=0}^{5} k_{s,p} \times I_{n,p,s}. \quad (12)$$

Where $I_{n,p,s}$ denotes a pixel output value corresponding to the number p of a microlens numbered around the n-th rod lens $21_n$ and the pixel number s of a light-sensitive pixel belonging to the microlens. When an allocation number of a microlens immediately below the n-th rod lens $21_n$ is denoted by m (−6≤m≤6) and a pixel number of a light-sensitive pixel directly below the microlens is denoted by s, output of the light-sensitive pixel is denoted as $U_{n,m,s}$. Here, $I_{n,p,s}$ can be expressed by the following expressions (13):

$$I_{n,p,s} = \begin{cases} U_{n+1,m=p-13,s} & (7 \leq p \leq 16) \\ U_{n,m=p,s} & (-6 \leq p \leq 6) \\ U_{n-1,m=p+13,s} & (-16 \leq p \leq -7) \end{cases} \quad (13)$$

Note that, for $U_{n,m,s}$, one value of m corresponds to one microlens. For $I_{n,p,s}$, values of multiple combinations of {n, p} correspond to one microlens. For example, when n=0 and p=0, $I_{n=0,p=0,s}=U_{0,0,s}$. When n=1 and p=−13, $I_{n=1,p=−13,s}=U_{0,0,s}$, and when n=−1 and p=13, $I_{n=−1,p=13,s}=U_{0,0,s}$. That is, when numbering is performed with the variable p (−16≤p≤16) around the n=0 th rod lens, one microlens $34_{n,m}$ (n=0, m=0) corresponds to three combinations of {n=0, p=0}, {n=1, p=−13}, and {n=−1, p=13}.

Therefore, the image constructor 71 can construct the field-of-view image $M_n$ having 33 pixel values of $J_{−16}$ to $J_{16}$ per line in the main scanning direction X. Assuming that the number of pixels in the subscanning direction Y is $P_y$, the field-of-view image $M_n$ has $33 \times P_y$ pixels.

Note that, in the above configuration example, the range of the incident angle α=−9° to +9° corresponds to the range of p=−21 to +21. Since the luminance value of the surroundings is small, in the first example of the matrix K, it is set not to adopt luminance values in the ranges of −21≤p≤−17 and 17≤p≤21, however, the present embodiment is not limited thereto. The number of rows of the matrix K may be increased. For example, a matrix K in which values of matrix elements of s=0 and p=−19, −18, −17 are 1 and values of matrix elements of s=5 and p=19, 18, 17 are 1 may be configured.

In the first example of the matrix K, the number of s having a matrix element of 1 is two when p=−13, −12, −7≤p≤7, and p=12, 13, and the number of s having a matrix element of 1 is one when −11≤p≤−8 and 8≤p≤11. This is to avoid mixing with an image formed by adjacent rod lenses. In order to improve the balance of light quantity as compared with the first example, as a second example of the matrix K, a matrix like the following may be used.

$$K = \begin{bmatrix} 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\ 0 & 0 & 0 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 0 & 0 & 0 \\ 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 \end{bmatrix}$$

$$p = -16 \ldots -1 \quad 0 \quad 1 \ldots 15 \quad 16$$

$$m = -3 \ldots 6 - 6 \ldots -1 \quad 0 \quad 1 \ldots 6 - 6 \ldots 3$$

After step ST2, the image matching unit 72 executes image matching between the adjacent field-of-view images $M_i$ and $M_j$ and detects the displacement amount D(i, j) between the field-of-view images $M_i$ and $M_j$ (step ST3). Specifically, the image matching unit 72 can shift the pixel position of one of the adjacent field-of-view images $M_i$ and $M_j$ in the main scanning direction X and detect, as the displacement amount D(i, j), a shift amount at which the adjacent field-of-view images $M_i$ and $M_j$ coincide with each other. Here, the "shift amount at which the field-of-view images $M_i$ and $M_j$ coincide with each other" means a shift displacement amount at which the degree of similarity between the field-of-view images $M_i$ and $M_j$ is the highest. The degree of similarity can be calculated using, for example, the sum-of-squared difference (SSD) technique, sum-of-absolute difference (SAD) technique, or normalized correlation coefficient (NCC) technique that is widely used in image matching.

Next, the image corrector 73 estimates the transfer magnification $\tau_t$ of the boundary region between the field-of-view images $M_i$ and $M_j$ on the basis of the detected displacement amount D(i, j) using a lookup table prepared in advance (step ST4). In the lookup table, an estimated value of the transfer magnification $\tau_t$ corresponding to the displacement amount D(i, j) is stored.

Next, the image corrector 73 generates corrected field-of-view images $CM_1$ to $CM_N$ by correcting the field-of-view images $M_1$ to $M_N$ using the transfer magnifications $\tau_t$ to $\tau_{N-1}$ (step ST5). Specifically, on the basis of the transfer magnifications $\tau_t$ to $\tau_{N-1}$, the image corrector 73 can be correct the field-of-view images $M_1$ to $M_N$ by enlarging or reducing each of the field-of-view images $M_1$ to $M_N$ at a magnification of the reciprocal of the transfer magnification. As a method of enlarging or reducing the field-of-view image, for example, an image scaling technique such as a known bilinear interpolation method or a bicubic interpolation method can be used. Then, the composite image generator 74 combines the corrected field-of-view images $CM_1$ to $CM_N$ to generate a composite image (step ST6). This composite image is output as the captured image.

Figure 33:
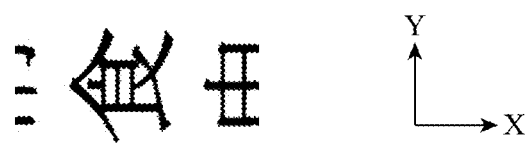
FIG. 33 is a diagram illustrating an example of an image to be captured.

Next, with reference to FIG. 33 and FIGS. 34A to 34I, a simulation result of the image processing will be described. FIG. 33 is a diagram illustrating an example of a document image formed on a surface of the target object 2. In FIG. 33, for convenience of description, the main scanning direction X and the subscanning direction Y are illustrated. FIGS. 34A to 34I are explanatory diagrams of simulation results of image processing. FIGS. 34A to 34C illustrate various images in the case of being just in focus (ΔZ=0), FIGS. 34D to 34F illustrate various images in the case of being defocused (ΔZ=+0.6 mm), and FIGS. 34G to 34I illustrate various images in the case of being defocused (ΔZ=−0.6 mm).

Furthermore, each of FIGS. 34A, 34D, and 34G is a sample of a raw captured image having a resolution of 3600 dpi in the main scanning direction X. That is, these captured images are images obtained by sequentially arranging the output $U_{n,m,s}$ of the light-sensitive pixels defined by the above expressions (13). As illustrated in FIG. 34A, a fine image is obtained at the time of being just in focus with Z=0, however as illustrated in FIGS. 34D and 34G, when ΔZ=0.6 mm or ΔZ=−0.6 mm, an image blurred in the main scanning direction X is generated. The reason why these blurred images are generated is because erect equal-magnification images by three rod lenses are superimposed.

On the other hand, each of FIG. 34B, FIG. 34E, and FIG. 34H represents three field-of-view images (resolution: 600 dpi) obtained from the three the rod lenses $21_{n-1}$, $21_n$, and $21_{n+1}$ (R=−1, 0, +1) of the above configuration example. That is, these field-of-view images are obtained by sequentially arraying the above $J_{n,p}$. For convenience of explanation, a black line is inserted between field-of-view images. FIGS. 34C, 34F, and 34I are reference diagrams illustrating simulation results by a rod lens array imaging system without the microlenses 34.

Comparing the images illustrated in FIGS. 34B, 34E, and 34H with the images illustrated in FIGS. 34C, 34F, and 34I, the sharpness of the image is significantly different when ΔZ=±0.6 mm. The field-of-view images illustrated in FIGS. 34E and 34H are finer than the images illustrated in FIGS. 34F and 34I. This is because the image blur illustrated in FIGS. 34F and 34I is largely derived from the fact that images with different magnifications are superimposed between adjacent rod lenses. For example, when ΔZ=0.6 mm, a field-of-view image obtained from each of the rod lenses is an image reduced in the main scanning direction X around the optical axis of the rod lens. Image blur occurs also for a single rod lens, but image shift due to the image reduction between adjacent rod lenses is larger than in this. Similarly, when ΔZ=−0.6 mm, a field-of-view image obtained from each of the rod lenses is an image enlarged in the main scanning direction X around the optical axis of the rod lens.

In the present embodiment, the field-of-view image obtained by each of the rod lenses is converted into an equal-magnification image (step ST5 in FIG. 32). Therefore, it is necessary to know to what extent a field-of-view image is reduced or increased. Note that, if the document distance to the target object 2 is known, the transfer magnification can be uniquely determined. Although it is possible to separately use a distance sensor to obtain the document distance, the document distance can be calculated also from a field-of-view image for each of the rod lenses as illustrated in FIGS. 34B, 34E, and 34H.

FIG. 35A and FIG. 35B are results obtained by extracting field-of-view images of R=−1 and R=0 from an image arrayed without overlapping adjacent images when ΔZ=0 as illustrated in FIG. 34B and executing image matching processing (step ST3). FIG. 35B is shifted by ΔX0=0.546 mm in the −X direction. Since the transfer magnification is 1 when ΔZ=0, a shift amount exactly equivalent to 13 pixels (=0.546/0.042) obtained by dividing ΔX0 by the pitch of microlenses is used.

Similarly, FIGS. 35C and 35D are results obtained by extracting field-of-view images of R=−1 and R=0 from an image arrayed without overlapping adjacent images when ΔZ=−0.6 as illustrated in FIG. 34H and executing image matching processing (step ST3). In FIG. 35D, a result shifted by ΔX1 in the −X direction is illustrated. When ΔZ<0, the transfer magnification is a magnification value greater than 1, thus ΔX1 is a value smaller than ΔX0. In this manner, the shift amount ΔX1 is uniquely determined depending on the transfer magnification. The relationship between the displacement amount and the transfer magnification can be calculated or measured in advance. Therefore, if the shift amount ΔX1 is known, the transfer magnification of a field-of-view image can be obtained (step ST4).

The image corrector 73 can obtain a corrected field-of-view image by enlarging or reducing the field-of-view image at the reciprocal of the obtained transfer magnification (step ST5). The composite image generator 74 can restore a sharp composite image by combining these corrected field-of-view images of the equal magnification (step ST6). If the processes of steps ST4 to ST6 are executed for all the field-of-view images, a fine composite image can be obtained even for an image to be scanned whose document distance changes in the main scanning direction X. Furthermore, if the processes of steps ST4 to ST6 are executed also in the subscanning direction Y, a fine composite image can be obtained. For example, a sharp composite image can be obtained even from a target object 2 such as a crumpled paper document or a book with a raised binding part.

As described above, in the image capturing device 1A according to the sixth embodiment, when constructing the n-th field-of-view image representing an erect equal-magnification image formed by the n-th rod lens $21_n$, the image signal processor 70 constructs the n-th field-of-view image on the basis of received signals output from main light-sensitive pixels without using received signals output from sub light-sensitive pixels out of a plurality of light-sensitive pixels on the bottom surfaces of microlenses $34_{n,-6}$, . . . , $34_{n,0}$, . . . , $34_{n,6}$ corresponding to the n-th rod lens $21_n$. Therefore, it is possible to obtain a captured image in which deterioration of the depth of field caused by superimposed regions of erect equal-magnification images between the rod lenses $21_n$ and $21_{n+1}$ and between the rod lenses $21_n$ and $21_{n-1}$ is suppressed.

In addition, the image signal processor 70 executes image matching between adjacent field-of-view images to detect a displacement amounts between the field-of-view images (step ST3) and can correct the field-of-view images by using a transfer magnification corresponding to the detected displacement amounts (steps ST4 and ST5). Therefore, the image signal processor 70 can obtain an extremely sharp composite image (step ST6).

In this embodiment, the microlenses 34 of the microlens array 33 have a cylindrical lens surface having a non-zero curvature in the main scanning direction X as illustrated in FIG. 6, although no limitation thereto is intended. Instead of the microlens array 33, the microlens array 33A including the microlenses 34A having a lens surface having a non-zero curvature in both the main scanning direction X and the subscanning direction Y as illustrated in FIG. 17 may be used.

Furthermore, in the present embodiment, the rod lens array 20 is used as an imaging optical system, although no limitation thereto is intended. Instead of the rod lens array 20, an imaging optical system having a plurality of refractive lenses as the imaging optical elements 50 as illustrated in FIGS. 18A and 18B may be used.

Moreover, as illustrated in FIG. 22, the light source 11 is arranged on the same side as the rod lens array 20 with respect to the target object 2. Another light source may be arranged on the opposite side of the target object 2 such that light transmitted by the surface to be scanned of the target object 2 and scattered enters the rod lens array 20. This enables implementing an image capturing device that generates a captured image based on transmitted scattered light like a banknote reader used for ATMs.

Seventh Embodiment

Figure 36:
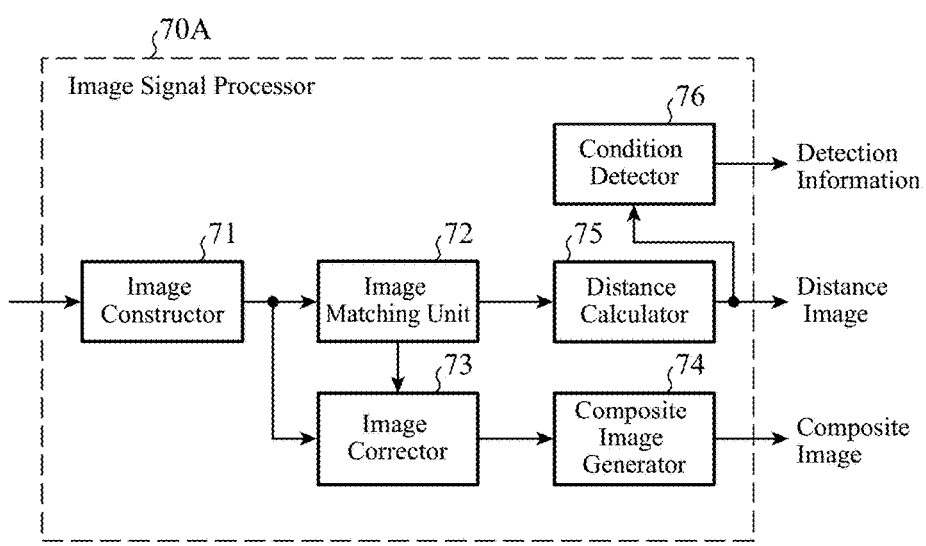
FIG. 36 is a block diagram illustrating a schematic configuration of an image signal processor included in an image capturing device of a seventh embodiment according to the present invention.

Next, a seventh embodiment according to the present invention will be described. FIG. 36 is a block diagram illustrating a schematic configuration of an image signal processor 70A incorporated in an image capturing device of the seventh embodiment according to the present invention. A configuration of the image capturing device of the present embodiment is the same as that of the image capturing device 1A of the sixth embodiment except that the image signal processor 70A of FIG. 36 is included instead of the image signal processor 70 of FIGS. 22 and 29.

The image signal processor 70A illustrated in FIG. 36 has an image constructor 71, an image matching unit 72, an image corrector 73, and a composite image generator 74 like the image signal processor 70 of the first embodiment. The image signal processor 70A of the present embodiment further includes: a distance calculator 75 that calculates the document distance (distance to a target object) in a boundary region of each of field-of-view images $M_1$ to $M_N$ on the basis of the shift amounts between field-of-view images of adjacent rod lenses estimated by the image matching unit 72; and a condition detector 76 that detects the condition of the target object 2 on the basis of the calculated document distance.

FIG. 37 is a flowchart illustrating an exemplary procedure of image processing of the seventh embodiment. Referring to FIG. 37, the image constructor 71, the image matching unit 72, the image corrector 73, and the composite image generator 74 execute the above steps ST1 to ST6. Using the displacement amount D(i, i+1) calculated in the above step ST3, the distance calculator 75 refers to a lookup table prepared in advance and calculates the document distance $d_1$ to $d_{N-1}$ in boundary regions of field-of-view images $M_1$ to $M_N$, respectively (step ST4). Note that, since there is a one-to-one relationship between the displacement amount D(i, i+1) and the transfer magnification $\tau_i$ of each boundary region, the document distance $d_i$ may be derived from the transfer magnification $\tau_i$ of a boundary region.

In the lookup table, an estimated value of the document distance corresponding to the displacement amount D(i, i+1) is stored. These document distances $d_1$ to $d_{N-1}$ are output as a depth map. Since the transfer magnification of a field-of-view image obtained from each of the rod lenses $21_n$ corresponds to the document distance on a one-to-one basis, the document distance can be calculated from the shift amount.

Here, the spatial resolution in the main scanning direction (X direction) of the depth map is the pitch Pr of the rod lens array 20, which is coarser than the pitch of the pixels. Therefore, the distance calculator 75 may generate a two-dimensional distribution (distribution on an X-Y plane) of the document distance as a depth map with a finer accuracy than the pitch Pr of the rod lens array 20 by executing interpolating processing such as interpolation.

Next, the condition detector 76 detects the condition of the target object 2 on the basis of the document image obtained in step ST4 (step ST8). For example, the condition detector 76 can detect the presence or absence of a protrusion or scratch in a tape or material of the target object 2, or detect the degree of unevenness of the target object 2. Alternatively, the condition detector 76 may output the detection result as a result of inspection of a surface to be scanned of the target object 2. In particular, in the present embodiment, it is possible to discriminate minute unevenness on a surface of a target object, and thus it is possible to inspect whether a tape is attached on a bill which is a target object. In addition, since it is possible to detect a mark of deep recess printing indicating unevenness formed on a bill together with its height, this largely contributes to authenticity detection of bills.

Although the various embodiments according to the present invention have been described with reference to the drawings, these embodiments are examples of the present invention, and thus various forms other than these embodiments can be adopted.

Moreover, within the scope of the present invention, any combinations of the first to the seventh embodiments, modifications of any components in the respective embodiments, or omissions of any components in the respective embodiments can be made. For example, a combination of the second embodiment and the third embodiment can be made, and a combination of the fourth embodiment and the fifth embodiment can be made.

INDUSTRIAL APPLICABILITY

Because an image capturing device according to the present invention is capable of capturing an image formed on a surface of a target object such as a document with a high accuracy, the image capturing device is suitable for use in a copying machine, an image scanner, a facsimile machine, a banknote reader, and a surface inspection device, for example. In the case where an image capturing device according to the present invention is applied to a surface inspection device, the image capturing device can be used for detecting scratches, dirt, defects, color tint on a surface of the target object, or the position of an object formed on the surface.

REFERENCE SIGNS LIST 1, 1A: image capturing devices; 2: Target object; 10, 10A: Contact image sensor (CIS) units; 11: Light source; 12, 12A: Housings; 20: Rod lens array; $21_1$ to $21_N$: Rod lenses; 30: Sensor substrate; 31, 31K, 61: Imaging units; 31R: Red line sensor; 31G: Green line sensor; 31B: Blue line sensor; 31A, 31P: Peripheral circuits; 32r, 32g, 32b, 32x, 32xa, 62: Light-sensitive pixels; 33, 33A: Microlens arrays; 34, 34A: Micro condenser lenses; 35, 35A: Light shielding patterns; 35s: Openings; 40, 40: Image signal processors; 50: Imaging optical elements; 51 to 54: Refractive lenses; 70, 70A: Image signal processors; 71: Image constructor; 72: Image matching unit; 73: Image corrector; 74: Composite image generator; 75: Distance calculator; 76: Condition detector; X: Main scanning direction; and Y: Subscanning direction.

The invention claimed is:

1. An image capturing device, comprising:
an imaging optical system including N imaging optical elements that are arrayed along a main scanning direction that is set in advance where N is an integer larger than or equal to 2, each of the N imaging optical elements forming an erect equal-magnification image on the basis of light scattered by a target object;
a microlens array including P micro condenser lenses that are arranged along the main scanning direction at focal positions of the N imaging optical elements where P is an integer larger than N; and
an imaging unit including P light-sensitive pixels or P sets of light-sensitive pixel groups that are arranged at positions where light rays are condensed by the microlens array, and are provided to correspond to the P micro condenser lenses, respectively,
wherein each of the micro condenser lenses has a refractive power to condense, among light rays incident from the imaging optical system, light rays incident at an incident angle within a limited angle range that is set in advance, onto positions different from positions on which light rays incident at an incident angle outside the limited angle range are incident, and
the P light-sensitive pixels or the P sets of light-sensitive pixel groups have an effective light-sensitive region to receive only light rays incident on each of the micro condenser lenses at an incident angle within the limited angle range, among principal rays passed through the N imaging optical elements.

2. The image capturing device according to claim 1, wherein a relational expression given as $$\alpha_L = \operatorname{Arctan}[ha/(2 \times f_M)] < \beta$$

is satisfied, where $f_M$ denotes a focal length of each of the micro condenser lenses, ha denotes a light reception width of the effective light-sensitive region in the main scanning direction, $\beta$ denotes a half angle of a field of view in the main scanning direction of each of the imaging optical elements, and $\alpha_L$ denotes a limit angle defining the limited angle range.

3. The image capturing device according to claim 1, further comprising a light shielding pattern formed between the microlens array and the imaging unit,
wherein the light shielding pattern shields a light ray incident at an incident angle outside the limited angle range and condensed by each of the micro condenser lenses, among light rays incident on each of the micro condenser lenses.

4. The image capturing device according to claim 1, a relational expression given as $$f_M \times \tan \beta < Pt - ha/2$$

is satisfied, where $f_M$ denotes a focal length of each of the micro condenser lenses, β denotes a half angle of a field of view in the main scanning direction of each of the imaging optical elements, ha denotes a light reception width in the main scanning direction of the effective light-sensitive region, and Pt denotes an array pitch in the main scanning direction of the micro condenser lenses.

5. The image capturing device according to claim 1, wherein a relational expression given as $$f_M \times \tan \beta < Pt/2$$

is satisfied, where $f_M$ denotes a focal length of each of the micro condenser lenses, β denotes a half angle of field of view in the main scanning direction of each of the imaging optical elements, and Pt denotes an array pitch in the main scanning direction of the P micro condenser lenses.

6. The image capturing device according to claim 3, wherein:
the light shielding pattern has a plurality of openings that are formed to face the light-sensitive pixels, respectively; and
the plurality of openings allows only light rays incident at an incident angle within the limited angle range to pass through, among light rays incident on each of the micro condenser lenses.

7. The image capturing device according to claim 6, wherein:
each of the P micro condenser lenses has a cylindrical lens surface having a curvature in the main scanning direction; and
each of the openings forms a slit extending along a top part of the lens surface.

8. The image capturing device according to claim 6, wherein a positional displacement amount in the main scanning direction is formed between a center of each of the openings and an optical axis of a micro condenser lens which condenses light rays onto said each of the openings among the P micro condenser lenses; and
the positional displacement amount increases as said each of the openings is apart from an optical axis of an imaging optical element corresponding to said each of the openings among the N imaging optical elements.

9. The image capturing device according to claim 1, wherein each of the P micro condenser lenses has a lens surface having a non-zero curvature in both the main scanning direction and a direction orthogonal to the main scanning direction.

10. The image capturing device according to claim 1, wherein:
the imaging unit includes a signal processing circuit for processing output signals of the P light-sensitive pixels or the P sets of light-sensitive pixel groups; and
the signal processing circuit is provided in a region not receiving light other than the effective light-sensitive region.

11. The image capturing device according to claim 1, wherein the imaging optical system has a rod lens array including N rod lenses as the N imaging optical elements.

12. The image capturing device according to claim 1, wherein the imaging optical system has a group of refractive lenses for forming the erect equal-magnification image as the N imaging optical elements.

13. The image capturing device according to claim 1, further comprising an image signal processor for generating a captured image by constructing N field-of-view images representing an erect equal-magnification image formed by the N imaging optical elements, and for combining the N field-of-view images to thereby generate a captured image,
wherein the image signal processor includes an image constructor for selecting, for each principal ray passing through each of the imaging optical elements, received signals output from a plurality of main light-sensitive pixels included in the effective light-sensitive region, from among received signals output from the P sets of light-sensitive pixel groups, and for constructing a field-of-view image corresponding to the imaging optical element of the N field-of-view images, on the basis of the selected received signals.

14. The image capturing device according to claim 13, wherein the image signal processor includes:
an image matching unit for performing image matching between adjacent field-of-view images of the N field-of-view images, and for detecting displacement amounts between the adjacent field-of-view images;
an image corrector for estimating transfer magnifications of the respective N field-of-view images on the basis of the detected displacement amounts, and for correcting the N field-of-view images by enlarging or reducing each of the N field-of-view images using the estimated transfer magnifications; and
a composite image generator for generating a composite image by combining the corrected N field-of-view images, and for outputting the composite image as the captured image.

15. The image capturing device according to claim 14, wherein the image matching unit shifts a pixel position of one of the adjacent field-of-view images in the main scanning direction to detect, as each of the displacement amounts, a displacement amount at which the adjacent field-of-view images coincide with each other.

16. The image capturing device according to claim 14, further comprising:
a distance calculator for calculating a distance to the target object for each of the N field-of-view images, on the basis of the transfer magnifications estimated by the image corrector; and
a condition detector for detecting a condition of the target object on the basis of the calculated distance.

17. The image capturing device according to claim 13, wherein each of the P micro condenser lenses has a cylindrical lens surface having a curvature in the main scanning direction.

18. The image capturing device according to claim 13, wherein each of the P micro condenser lenses has a lens surface having a non-zero curvature in both the main scanning direction and a direction orthogonal to the main scanning direction.

19. The image capturing device according to claim 13, wherein the imaging optical system has a rod lens array including rod lenses as the imaging optical elements.

20. The image capturing device according to claim 13, wherein the imaging optical system has a group of refractive lenses for forming the erect equal-magnification image as the imaging optical elements.

* * * * *